United States Patent [19]

Yasuho et al.

[11] Patent Number: 5,346,402

[45] Date of Patent: Sep. 13, 1994

[54] ELECTRONIC CIRCUIT DEVICE AND MANUFACTURING METHOD THEREOF

[75] Inventors: Takeo Yasuho, Neyagawa; Hirofumi Tajika, Osaki; Katsumi Kohzu, Ikoma, all of Japan

[73] Assignee: Matsushita Electric Industrial Co., Ltd., Osaka, Japan

[21] Appl. No.: 19,671

[22] Filed: Feb. 19, 1993

[30] Foreign Application Priority Data

Mar. 9, 1992 [JP] Japan .................................. 4-050292
Jun. 8, 1992 [JP] Japan .................................. 4-147245

[51] Int. Cl.⁵ .......................................... H01R 23/72
[52] U.S. Cl. ...................................... 439/71; 29/883; 361/735; 439/69; 439/331; 439/487
[58] Field of Search ..................................... 439/68–73, 439/331, 487; 361/394, 395, 393, 396, 735; 174/52.4; 29/883

[56] References Cited

U.S. PATENT DOCUMENTS

| | | | |
|---|---|---|---|
| 3,771,109 | 11/1973 | Bruckner et al. | 439/345 |
| 4,433,886 | 2/1984 | Cassarly et al. | 439/71 |
| 4,648,666 | 3/1987 | Lovell | 174/52.4 |
| 4,872,843 | 10/1989 | Anstey | 439/69 |
| 4,890,199 | 12/1989 | Beutler | 439/607 |

FOREIGN PATENT DOCUMENTS 3160796 7/1991 Japan .
423396 1/1992 Japan .

*Primary Examiner*—Neil Abrams
*Attorney, Agent, or Firm*—Stevens, Davis, Miller & Mosher

[57] ABSTRACT

It is an object of the invention to provide an electronic circuit device in which semiconductor elements, resistors, capacitors and the like are packaged onto an insulating substrate such as a ceramic substrate or the like, wherein high-density packaging is realized. A circuit module comprises a terminal section having an annular insulating frame body and a plurality of terminals provided on respective portions of the frame body to extend outwardly therefrom, and a circuit substrate having wiring patterns each adapted for connection with the respective terminals of the terminal section and packaging to one surface of the circuit substrate surface packaging parts, the circuit substrate being connected to the terminals with the surface packaging parts directed toward the inside of the terminal section. One circuit module is stacked on the other circuit module to be connected to the latter by the terminals. Thus high-density packaging can be readily realized.

18 Claims, 28 Drawing Sheets

FIG. 4
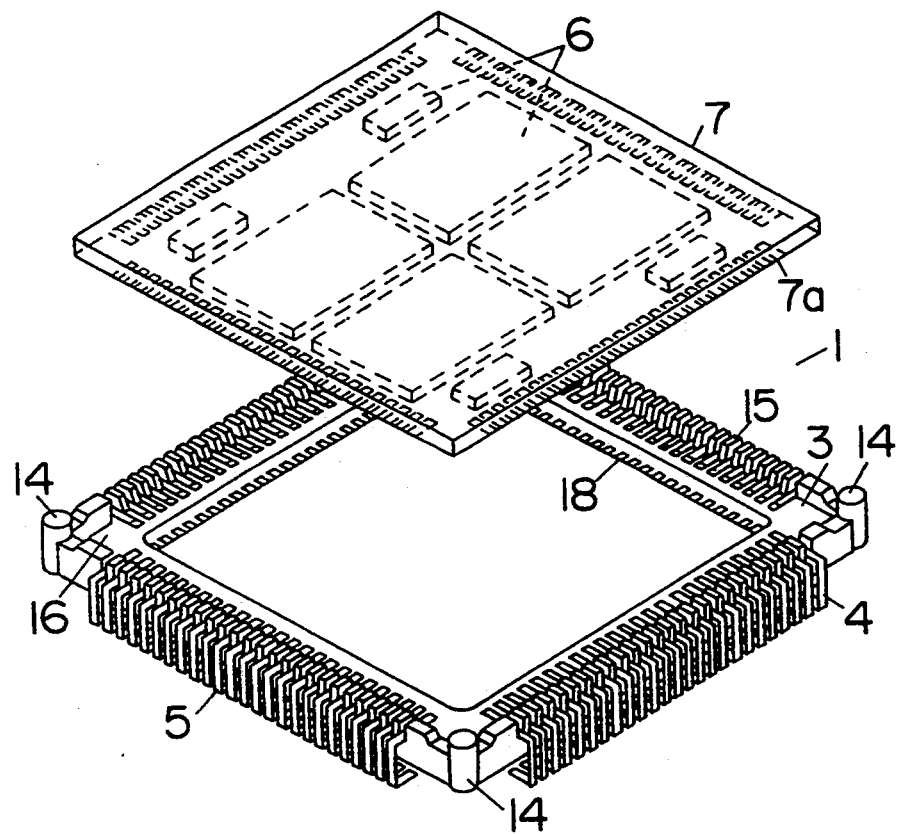
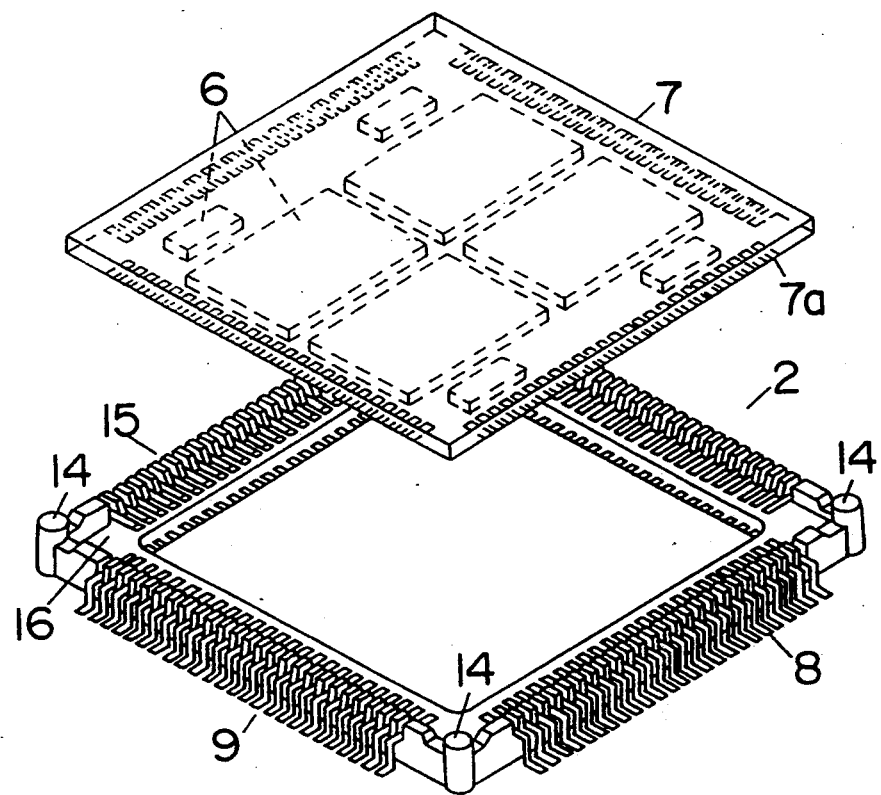

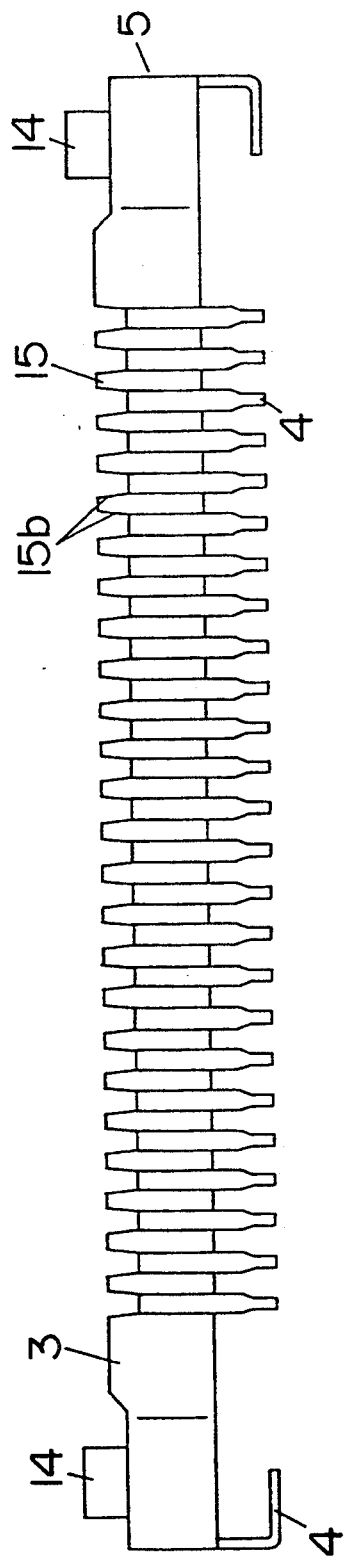
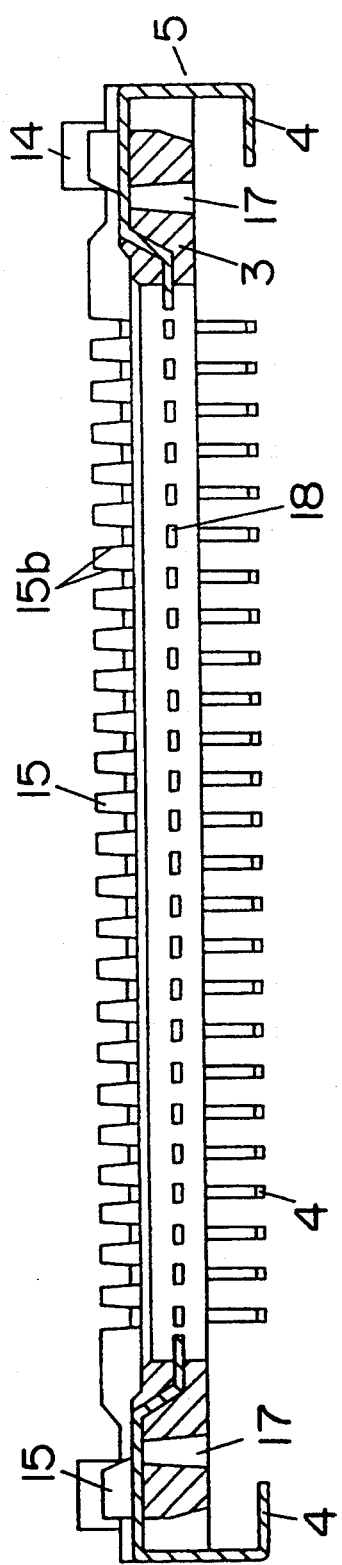
FIG. 12A
FIG. 12B

F I G. 15
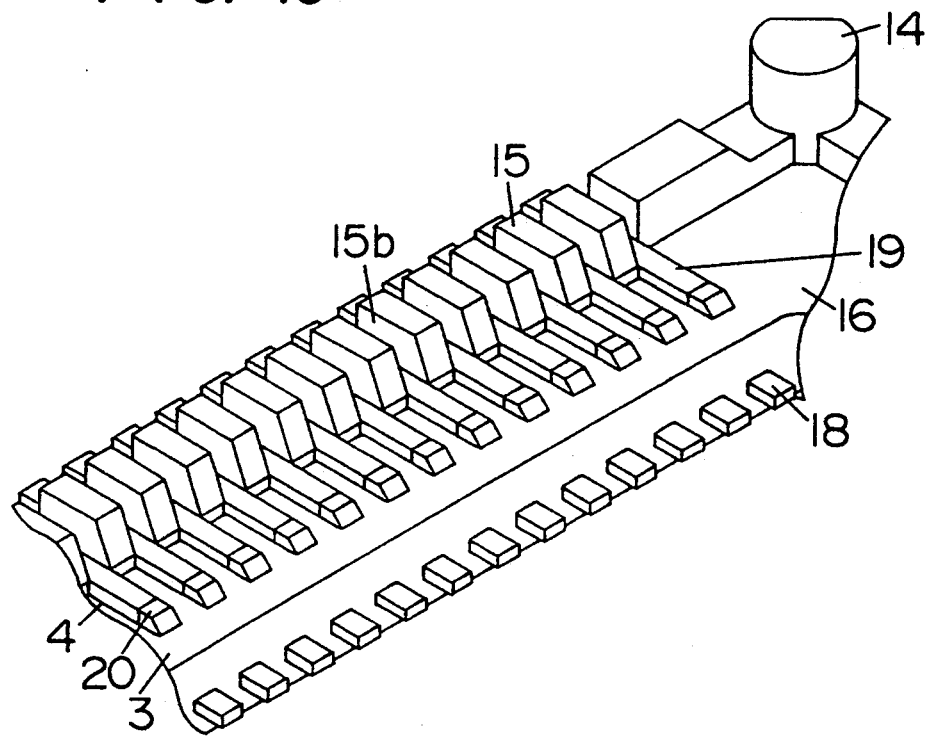
F I G. 16
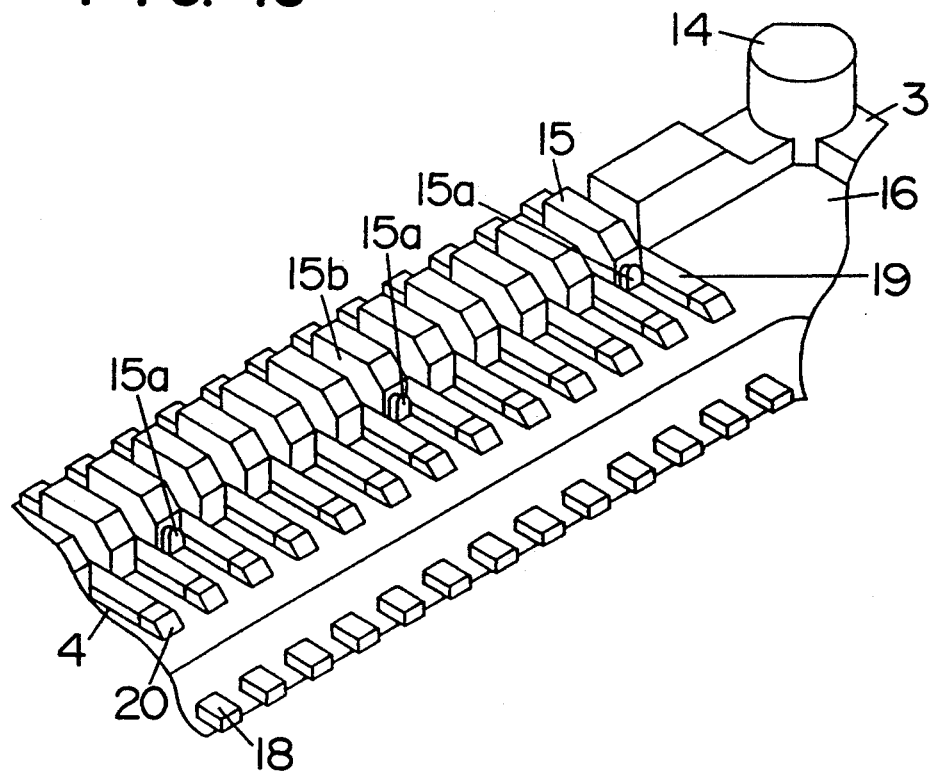

F I G. 22
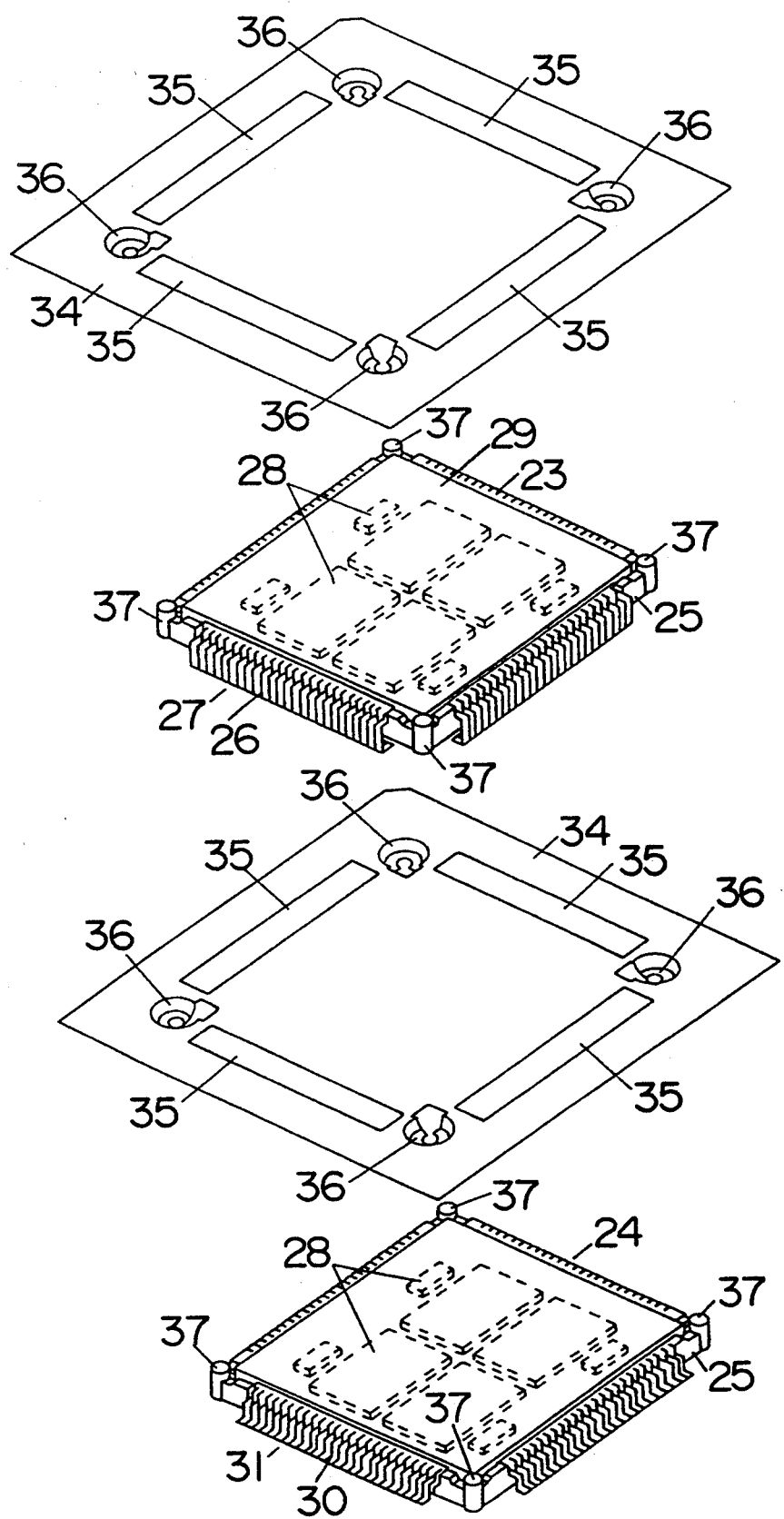

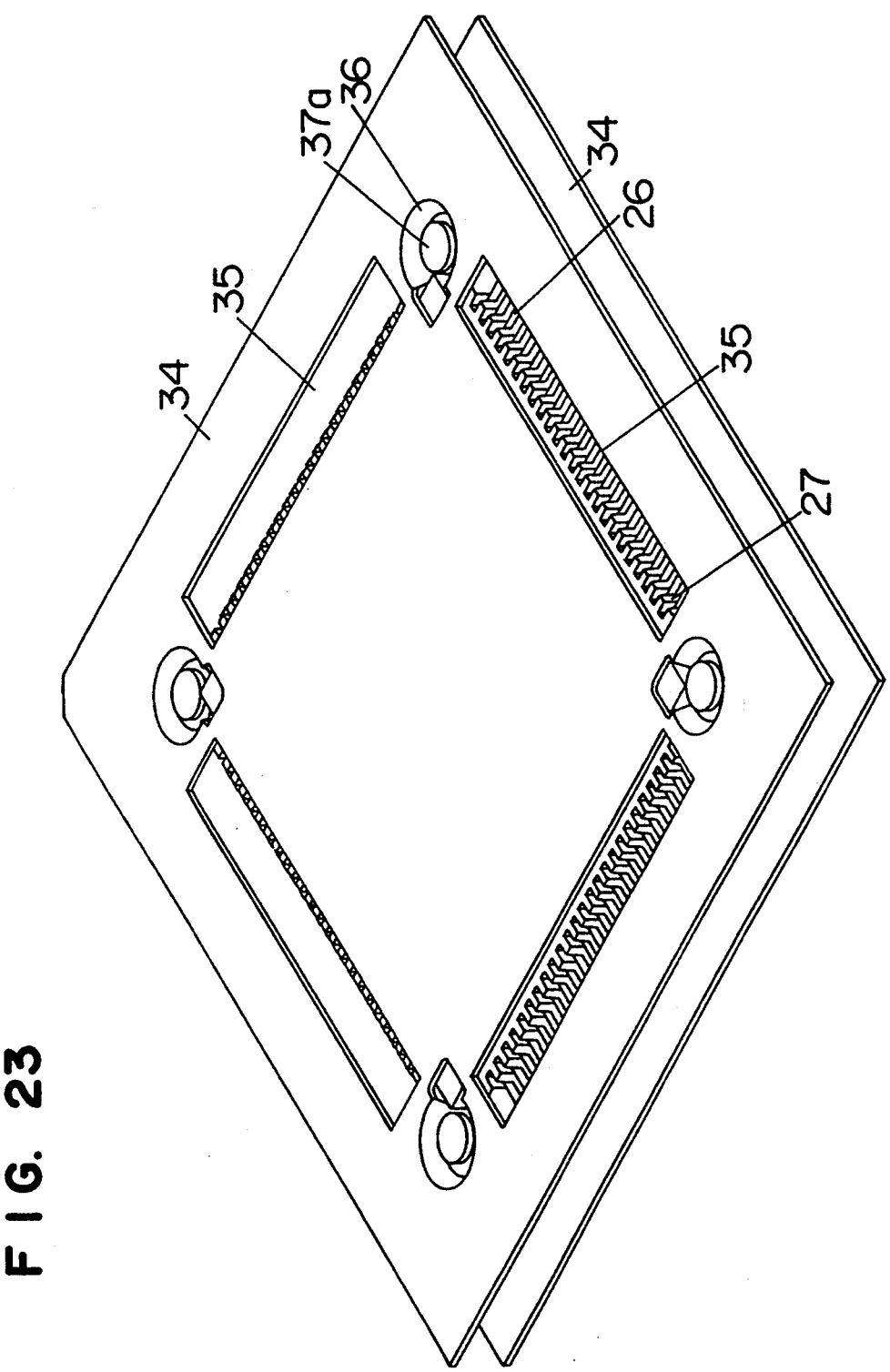

FIG. 30
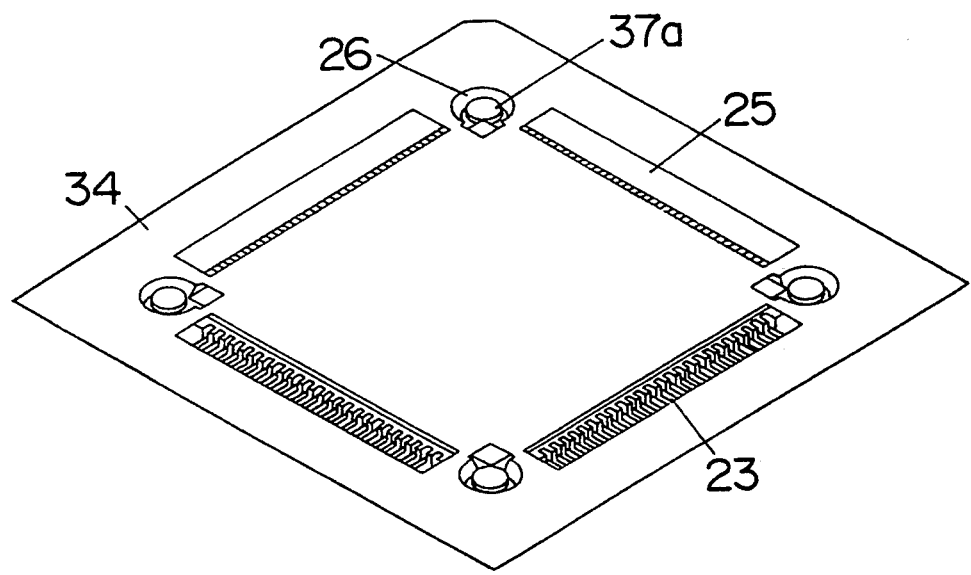
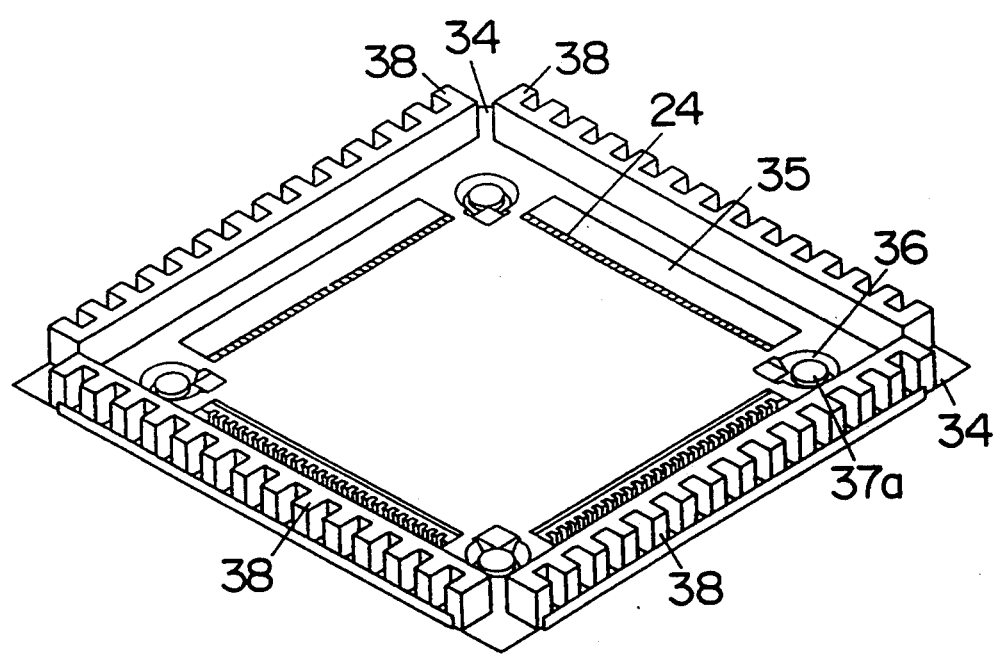

ELECTRONIC CIRCUIT DEVICE AND MANUFACTURING METHOD THEREOF

BACKGROUND OF THE INVENTION

The present invention relates to an electronic circuit device and a manufacturing method thereof, in which circuit device semiconductor elements, resistors, capacities or condensers and the like are packaged on an insulating substrate such as a ceramic substrate or the like.

In recent years, in an electronic circuit device in which resistors, capacitors, semiconductor elements and the like are packaged onto an insulating substrate, it has strongly been demanded to perform packaging of a high density, in keeping with reduction in weight, reduction in thickness and reduction in length of an instrument.

In a case where an attempt is made to perform packaging of parts or elements of a high density in the electronic circuit device of this kind, it has conventionally been realized by such an arrangement that a wiring pitch is made fine, or by such an arrangement that multiple substrates each having packaged thereon a plurality of semiconductor elements are stacked or piled up each other.

In such conventional electronic circuit device, however, in a case where an attempt is made to reduce the wiring pitch to realize packaging of a high density, such packaging has been limited. Thus, only making the wiring pitch fine cannot meet fully with the demand for packaging of a high density.

Further, in the case where a plurality of substrates on which parts are packaged are piled up each other, connection between the plurality of substrates is effected by lead pins. However, in order to secure insulation between the substrates, the substrates are arranged with spaces left therebetween and are connected to each other by a plurality of lead pins. The plurality of lead pins must be connected to each other while the lead pins are accurately positioned with respect to the substrates. An assembling operation has been extremely troublesome. Moreover, in a case of this structure, connection by means of the lead pins is difficult for the substrates of a fine pitch in which spacings between the lead pins are reduced. Thus, there is a problem in that such structure cannot be used in the substrates of the fine pitch.

SUMMARY OF THE INVENTION

The invention is directed to solving the above-discussed conventional problem, and it is an object of the invention to provide an arrangement capable of effecting packaging of a high density.

In order to solve the above-described object, the invention provides an electronic circuit device comprising a first circuit module or modules comprising a first terminal section having an annular insulating frame body and a plurality of terminals provided on respective portions of said frame body to extend outwardly therefrom in a C-shaped configuration, and a first circuit substrate having wiring patterns each adapted for connection with a respective one of the terminals of the first terminal section and packaging to one surface thereof surface packaging parts with the surface packaging parts directed toward the inside of the first terminal section, and a second circuit module comprising a second terminal section having an annular insulating frame body and a plurality of terminals provided on respective portions of said frame body to extend outwardly therefrom in a L-shaped configuration, and a second circuit substrate having wiring patterns each adapted for connection with the respective terminals of the second terminal section and packaging to one surface thereof surface packaging parts with the surface packaging parts directed toward the inside of the second terminal section, at least one of said first circuit modules being stacked on said second circuit module with said second circuit module disposed at the lowermost area of said stacked circuit modules, and the respective circuit modules being connected to one another by terminals.

With the arrangement described above, connection between the circuit substrates packaged in high density is effected through the terminal section. Moreover, the terminal section is constructed such that the plurality of terminals are accurately arranged on the frame body, Accordingly, it is possible to easily connect the circuit substrates packaged in high density.

DESCRIPTION OF DRAWINGS

FIG. 4 is an exploded perspective view showing principal portions of the electronic circuit device illustrated in FIG. 1;

FIG. 12A and FIG. 12B are a side elevational view and a cross-sectional view, respectively, showing the terminal section illustrated in FIG. 9;

FIG. 15 is an enlarged perspective view showing a principal portion of the terminal section illustrated in FIG. 9;

FIG. 16 is an enlarged perspective view showing another example of the terminal section illustrated in FIG. 9;

FIG. 22 is an exploded perspective view showing an electronic circuit device according to a fourth embodiment of the invention;

FIG. 23 is a perspective view showing an outer appearance of the electronic circuit device illustrated in FIG. 22;

FIG. 30 is a perspective view showing another example of parts of a principal portion of the electronic circuit device illustrated in FIG. 24;

DESCRIPTION OF THE PREFERRED EMBODIMENTS

Figure 1:
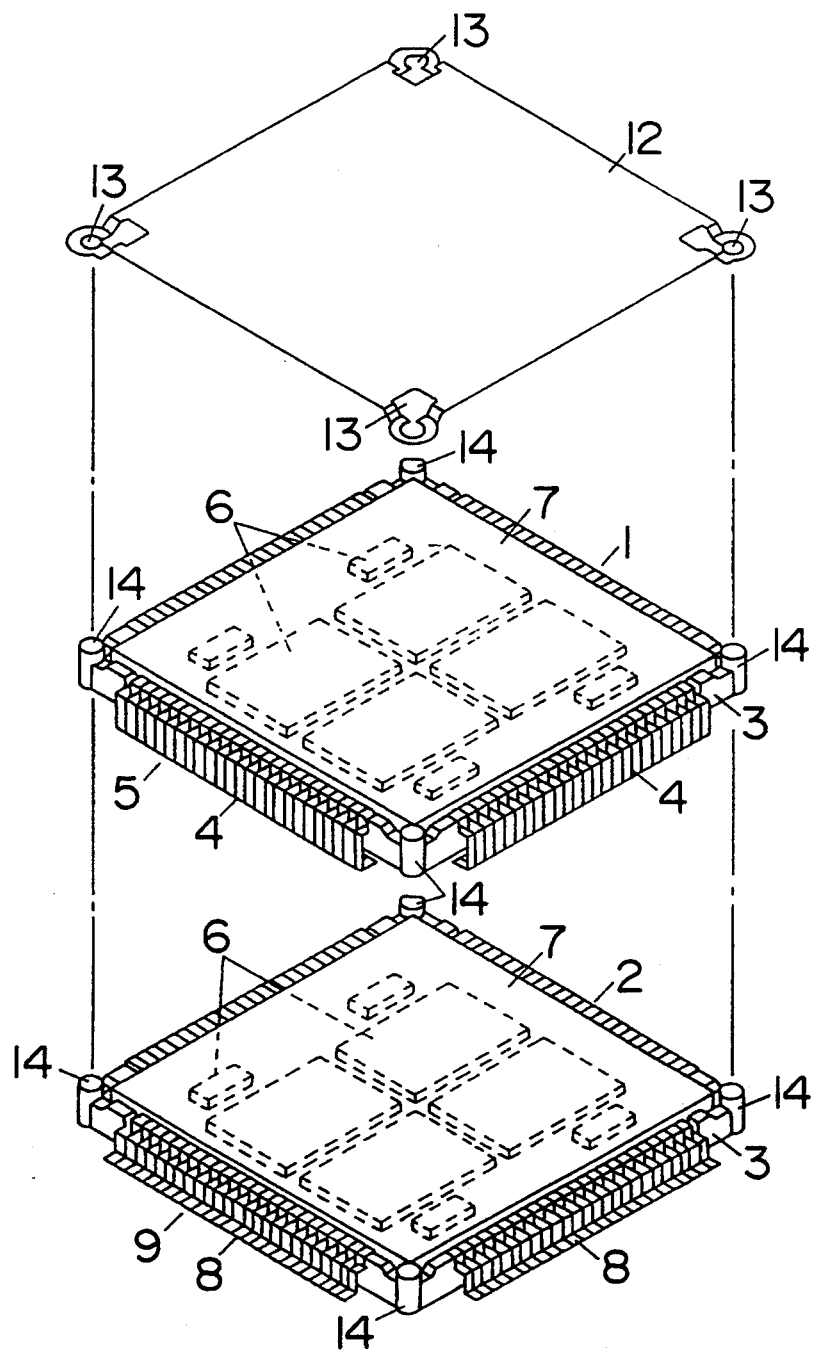
FIG. 1 is an exploded perspective view showing an electronic circuit device according to a first embodiment of the invention.
Figure 2:
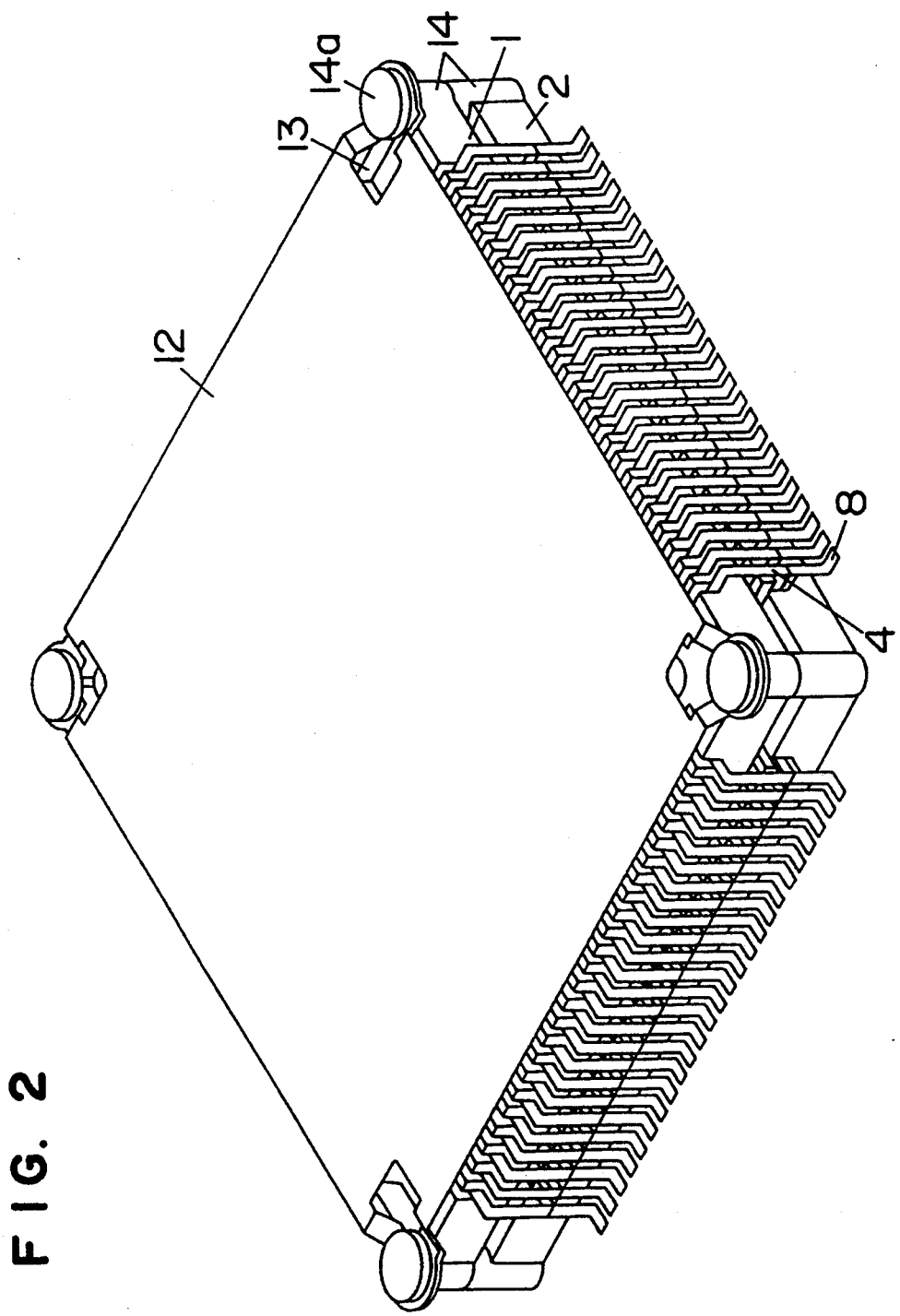
FIG. 2 is a perspective view showing an outer appearance of the electronic circuit device illustrated in FIG. 1.
Figure 3A:
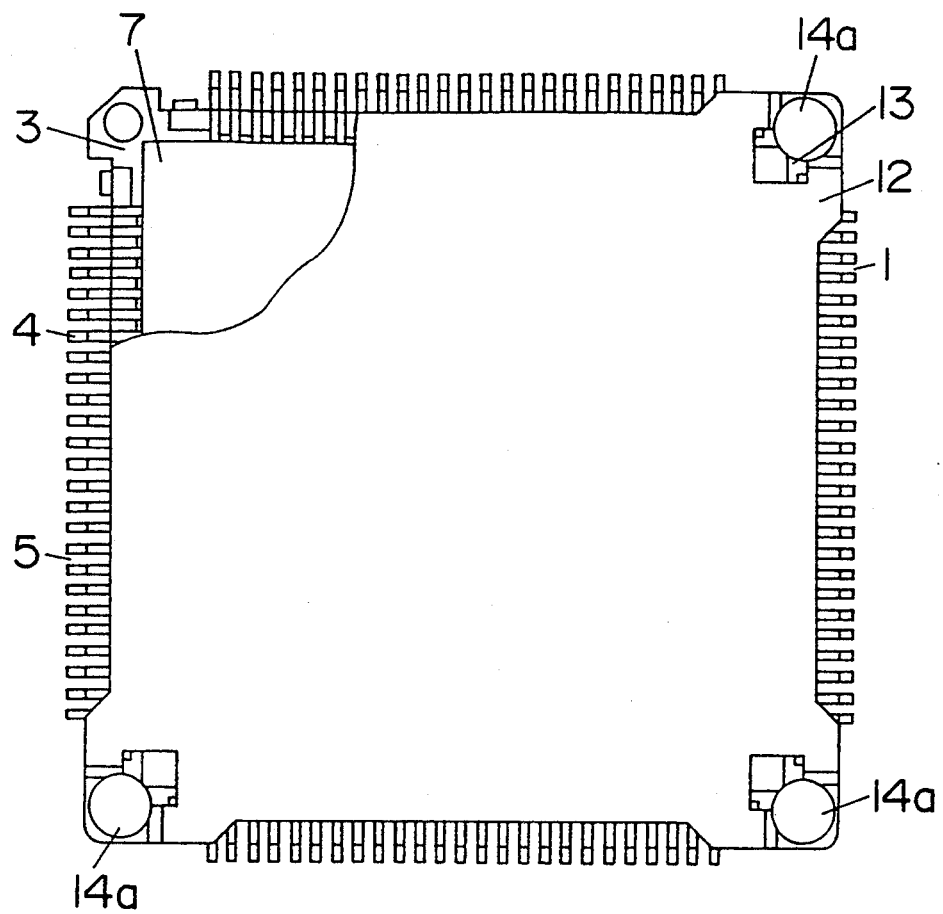
FIG. 3A and FIG. 3B are a top plan view and a side elevation view, respectively, showing the electronic circuit device illustrated in FIG. 2 with a portion thereof cut away.
Figure 3B:
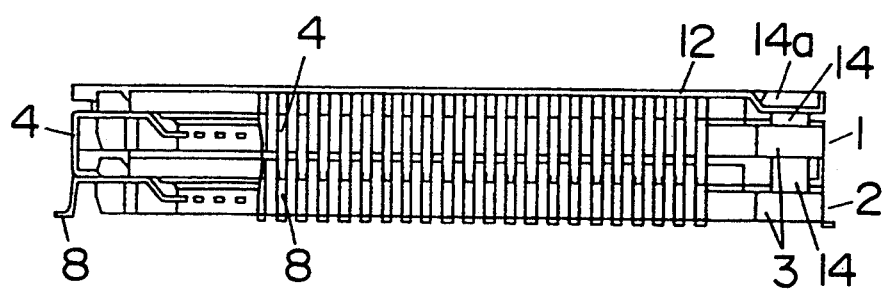

An electronic circuit device according to various embodiments of the invention will hereunder be described with reference to FIG. 1 to FIG. 36 of the accompanying drawings.

(FIRST EMBODIMENT)

FIG. 1 to FIGS. 3A and 3B show an electronic circuit device according to a first embodiment of the invention. FIG. 4 shows a circuit module portion of the electronic circuit device. In these figures, the reference numerals 1 and 2 denote circuit modules, respectively, each having a square plate configuration forming a predetermined electronic circuit. In the present embodiment, two circuit modules 1 and 2 are used.

Of the circuit modules 1 and 2, the circuit module 1 comprises a terminal section 5 having a square, annular frame body 3 formed of an insulating material such as synthetic resin or the like and a plurality of terminals 4 provided on the respective frame body portions to extend outwardly of the respective frame body portions and along the side and underside surfaces of the frame body 3 in a C-shaped configuration, and an insulating circuit substrate 7 having wiring patterns each adapted for connection with the respective terminals 4 of the terminal section 5 as by soldering and comprising a member of ceramic and the like, to one surface of which are packaged surface packaging parts 6 such as flip-chip type semiconductors, resistors, capacitors and the like. The reference numeral 7a denotes a connecting lead portion to which the terminals 4 are soldered, and which is arranged on a peripheral edge portion of the circuit substrate 7 in agreement with the arrangement of the terminals 4.

Further, similarly to the circuit module 1, the circuit module 2 comprises a terminal section 9 having a frame body 3 and a plurality of terminals 8 provided on the respective frame body portions to extend outwardly of the respective frame body portions and along the side and underside surfaces of the frame body 3 in an L-shaped configuration to assume a gull-wing shape, and an insulating circuit substrate 7 mounting thereon a circuit identical to or different from that of the circuit substrate 7 of the circuit module 1. In this connection, each of the terminals 8 of the terminal section 9 has a forward end thereof which is so arranged as to be flush with a lower surface of the frame body 3.

Furthermore, in the circuit modules 1 and 2, the circuit substrates 7 are connected respectively to the terminal sections 5 and 9 such that the side where the parts are surface packaged is directed inwardly of the terminal sections 5 and 9. Moreover, the terminal sections 5 and 9 have respective thicknesses such that the surface packaging parts 6 of the circuit substrates 7 do not extend beyond the terminal sections 5 and 9, respectively.

Figure 5:
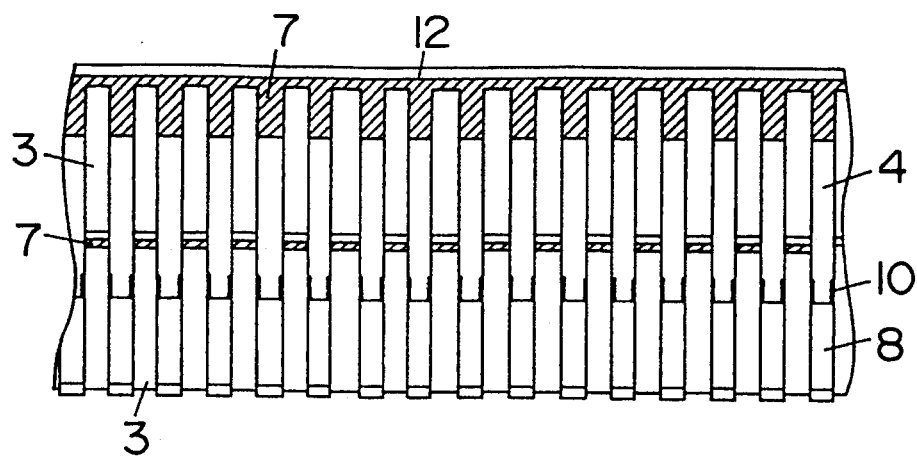
FIG. 5 is an enlarged view showing a structure of a principal portion of the electronic circuit device illustrated in FIG. 1.
Figure 6:
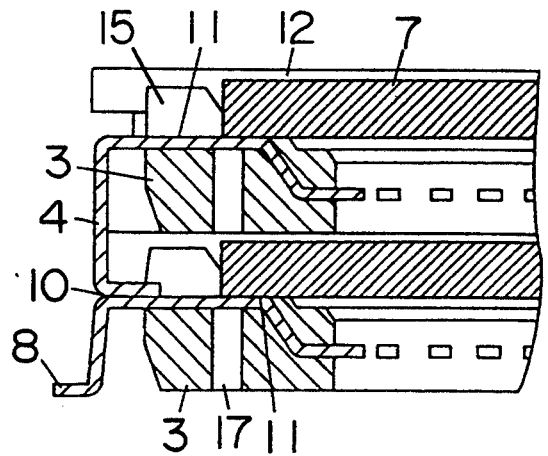
FIG. 6 is an enlarged cross-sectional view showing a structure of a principal portion of the electronic circuit device illustrated in FIG. 1.
Figure 7:
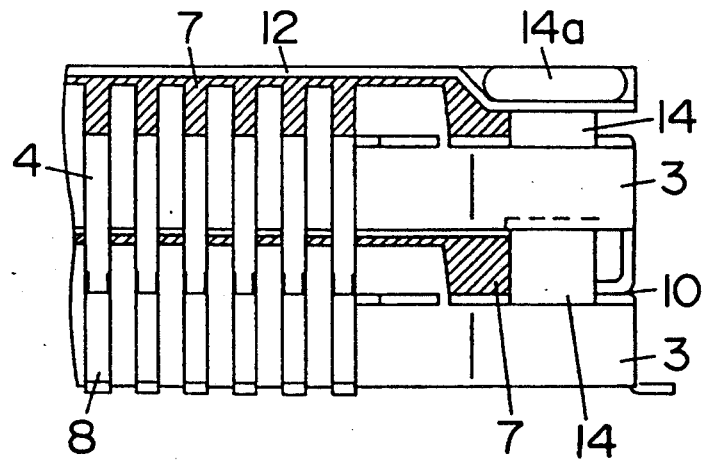
FIG. 7 is an enlarged view showing a structure of a principal portion of the electronic circuit device illustrated in FIG. 1.

As shown in FIGS. 5 to 7, these circuit modules 1 and 2 are aligned with each other such that the terminals 4 and 8 of the respective terminal sections 5 and 9 are in registration with each other, and the circuit module 1 is overlapped on the circuit module 2. The terminals 4 and 8 of the respective circuit modules 1 and 2 are electrically and mechanically connected to each other at abutment portions by soldering or the like. In this connection, in FIGS. 5 to 7, the reference numeral 10 denotes connecting areas where the terminals 4 are connected respectively to the terminals 8; and 11, connecting areas where the terminals 4 and 8 are connected respectively to the connecting lead portions 7a of the wiring patterns of the respective circuit substrates 7.

A roof 12 in the form of a square plate made of metal or non-metal is provided at an uppermost portion of the circuit modules 1 and 2 piled up each other in this manner, to effect electromagnetic shielding between the circuit modules 1 and 2. The roof 12 has an area thereof which is substantially the same as those of the circuit modules 1 and 2, and is provided, at four corners thereof, with fixing bores 13 for fixing the roof 12 onto the frame body 3 of the circuit module 1 by caulking. That is, the corner portions of each of the frame bodies 3 of the circuit modules 1 and 2 are provided with projections 14, respectively. The fixing bores 13 in the roof 12 are fitted over the projections 14, respectively. The projections 14 are pressed as shown in FIG. 7 so that the roof 12 is caulked to the projections 14 of the frame body 3, whereby the roof 12 is fixedly mounted on the frame body 3. In FIG. 7, the reference numeral 14a denotes a caulked portion which is provided by pressing of the projection 14.

Figure 8:
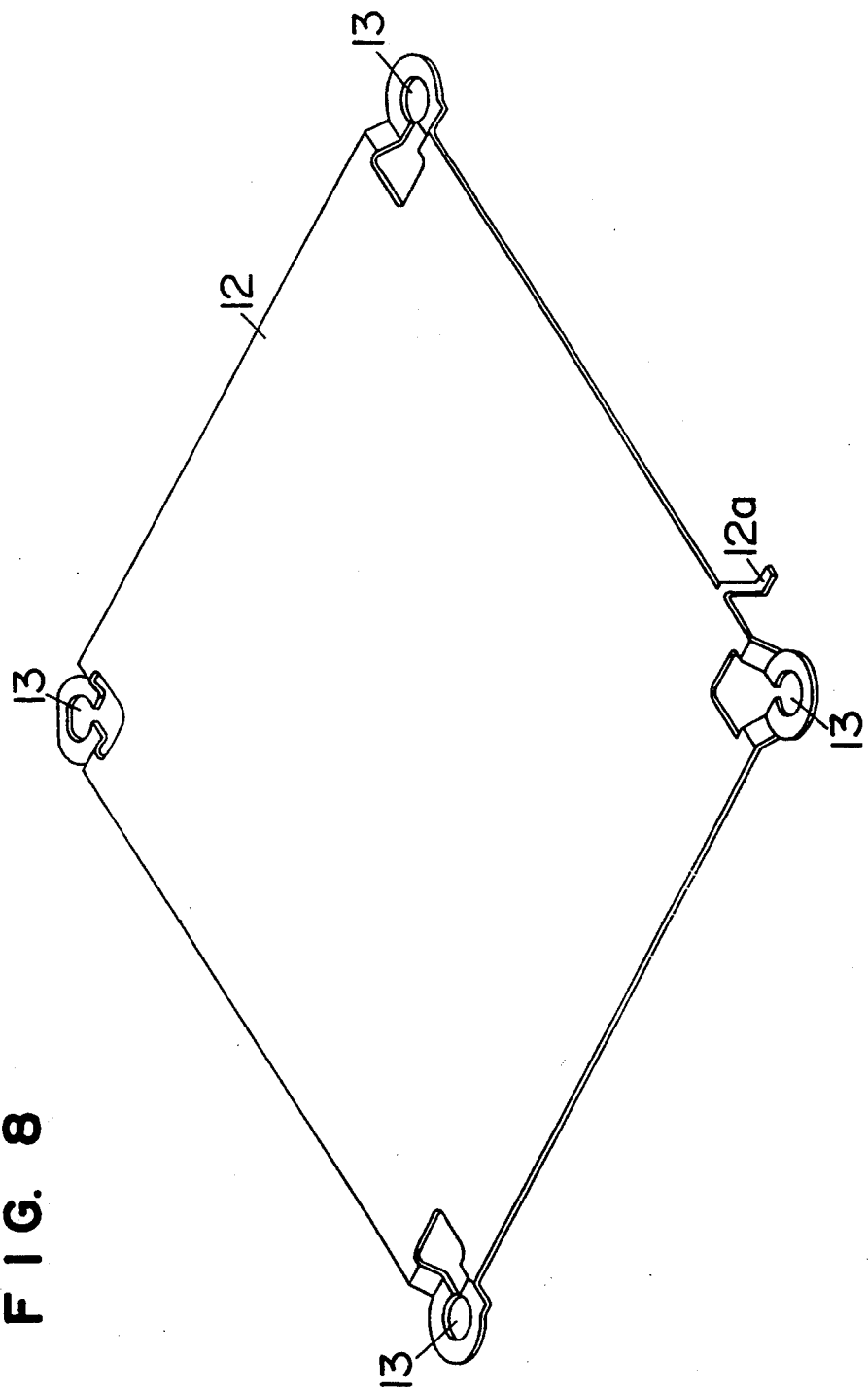
FIG. 8 is a perspective view showing another example of parts of a principal portion of the electronic circuit device illustrated in FIG. 1.

In connection with the above, when a shield connecting terminal 12a in the form of an L-shaped configuration as shown in FIG. 8 is provided integrally, and is connected to an earth portion of the circuit module 1, mounting of the roof 12 for electromagnetic shield is easily effected.

The terminal sections 5 and 9 of the respective circuit modules 1 and 2 will next be described in detail. In this connection, the terminal section 5 and the terminal section 9 are only different in terminals 4 and 8 from each other, but are the same as each other in other arrangements. Accordingly, in the following description, only the terminal section 5 will be described with reference to FIGS. 9 to 19A and 19B.

Figure 11:
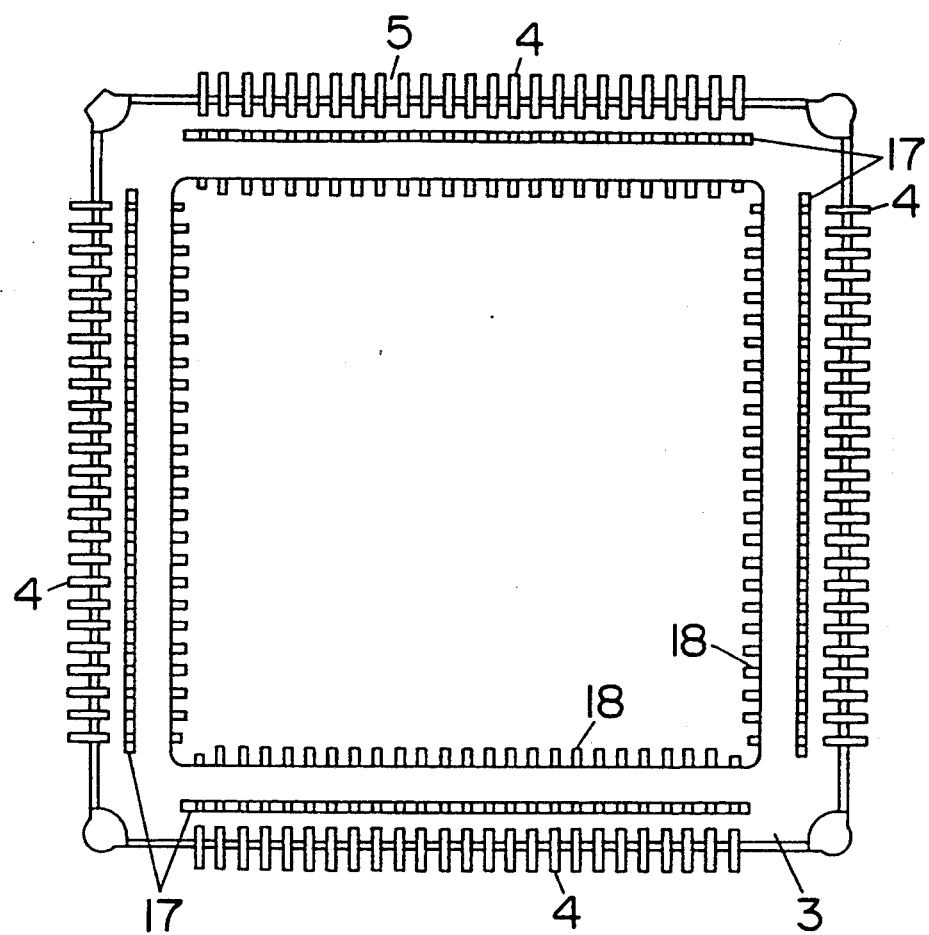
FIG. 11 is a top plan view as viewed from a rear surface of the terminal section illustrated in FIG. 9.

As shown in FIGS. 9 to 12A and 12B, the frame body 3 of the terminal section 5 is provided at an outer edge portion of each of the four frame side portions with a plurality of projecting portions 15 which are spaced apart a predetermined spacing from each other. The terminals 4 are extended out from between the projecting portions 15. Moreover, corner portions of the frame body 3 are provided respectively with planar portions 16 which are lower than the projecting portions 15 and the projections 14. Further, the frame body 3 is provided, at its underside with four bores 17 reaching the terminals 4, along the sides of the frame body as illustrated in FIG. 11.

Figure 13:
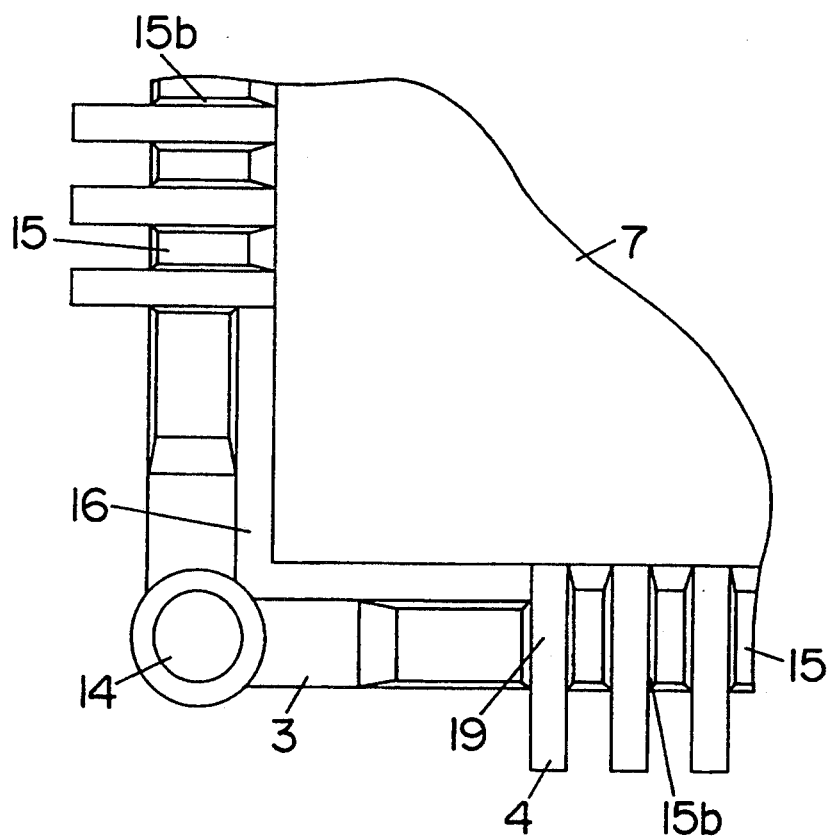
FIG. 13 is an enlarged view showing a principal portion of the terminal section illustrated in FIG. 9.
Figure 14:
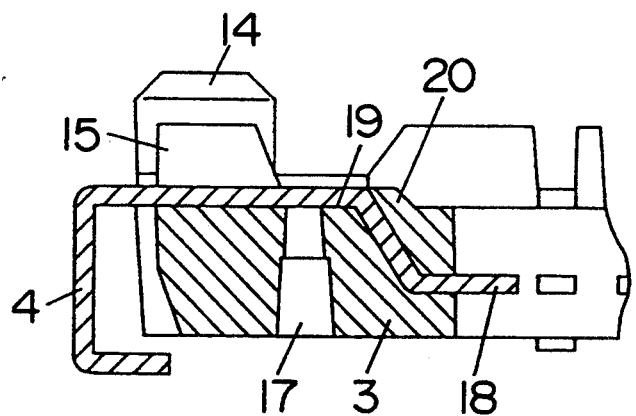
FIG. 14 is an enlarged cross-sectional view showing a principal portion of the terminal section illustrated in FIG. 9.

Furthermore, each of the terminals 4 of the terminal section 5 is so bent that a forward end portion thereof extends beyond the frame body 3. Each of the terminals 4 has a rearward end portion which is embedded in the frame body 3 as shown in FIG. 14, and projects from the inner peripheral surface of the frame body 3. Moreover, the terminal 4 has an intermediate portion thereof which is so provided as to be planar along an upper surface of the frame body 3 as shown in FIGS. 13 to 15, and which is so arranged as to slightly project from the upper surface of the frame body 3. In this connection, in FIGS. 13 to 15, the reference numeral 18 denotes a projecting portion projecting from the inner peripheral surface of the frame body 3 for the terminals 4, while the reference numeral 19 denotes a planar portion which is provided at the intermediate portion of a corresponding one of the terminals 4.

Further, the planar portion 19 of each of the terminals 4 has a boundary portion contiguous to a rearward end portion embedded within the frame body 3 and covered with a resin portion 20.

That is, each of the terminals 4 of the terminal section 5 is connected to the circuit substrate 7 at the planar portion 19 which projects from the upper surface of the frame body 3 as shown in FIG. 13.

In the present invention, the outer edges of each of the sides of the circuit substrate 7 abut against the projecting portions 15 of the frame body 3 to attain positioning of the substrate 7 in the frame body 3, whereby it is made possible to position the circuit substrate 7 with respect to the frame body 3, making it possible to accurately and easily effect connection between the terminal section 5 and the circuit substrate 7. In this connection, as shown in FIG. 16, some out of the plurality of projecting portions 15 may be provided at surfaces thereof, against which the side edges of the circuit substrate 7 are to abut, with small projections 15a which serve for positioning of the circuit substrate 7. With the arrangement, positioning accuracy can further be improved as compared with a case where positioning is effected by the projecting portions 15.

Furthermore, as shown in FIGS. 12A and 12B, a tapering portion 15b is provided on each of the projecting portions 15 to be gradually thinned in an upward direction, so that it is possible to cause the terminals 4 and 8 of the respective terminal sections 5 and 9 to be accurately in coincidence with each other, and electrical and mechanical connection such as soldering or the like at the abutting portions between the terminals 4 and 8 can reliably be effected.

Moreover, in the present invention, the frame body 3 of the terminal section 5 is provided at its corners with the projections 14. In the case where the circuit modules 1 and 2 are piled up each other in a multilayer, the circuit modules can easily be positioned and supported by the projections 14.

Figure 17:
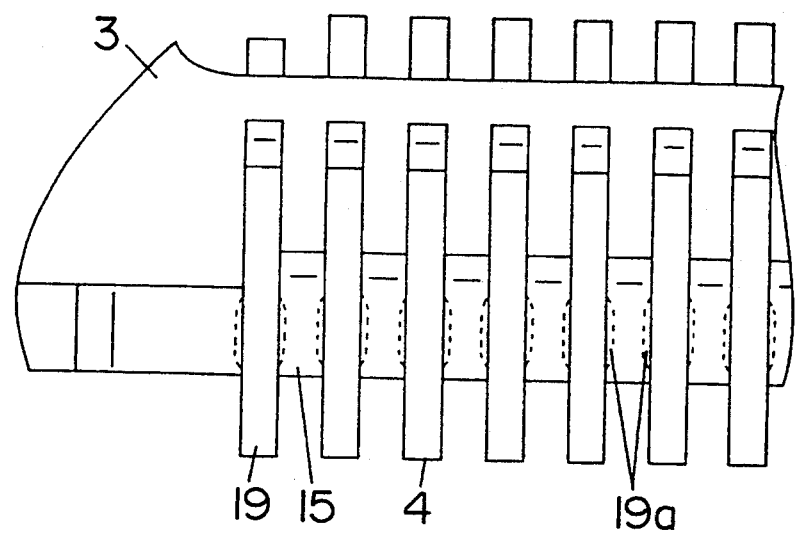
FIG. 17 is an enlarged view showing a principal portion of the terminal section illustrated in FIG. 9.
Figure 18:
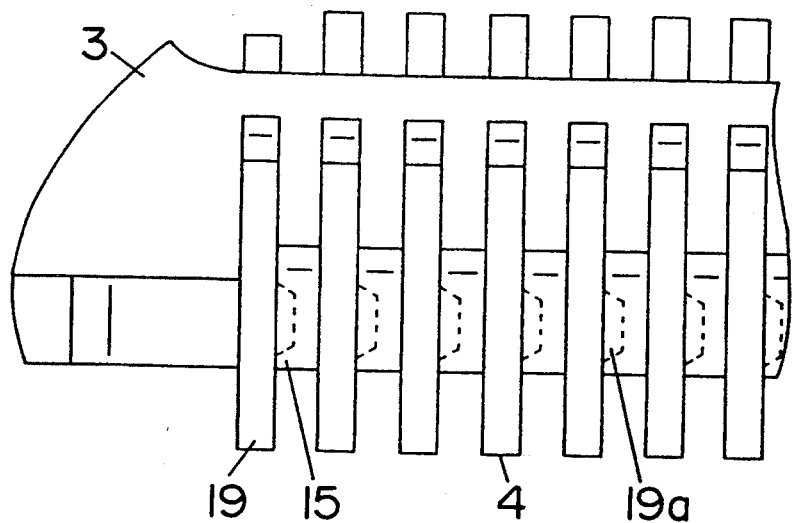
FIG. 18 is an enlarged view showing another example of the terminal section illustrated in FIG. 9.

Further, in the present invention, the planar portion 19 of the terminal 4 is partly embedded in the projecting portion 15 as shown in FIG. 17. The planar portion 19 of the terminal 4 is fixed by an embedded portion 19a, and accuracy of flatness is secured for the planar portion 19. In this connection, in an example illustrated in FIG. 17, the opposite sides of the planar portion 19 of the terminal 4 are embedded in the projecting portion 15. However, only one side of the planar portion 19 may be embedded in the projecting portion 15 as shown in FIG. 18.

Figure 9:
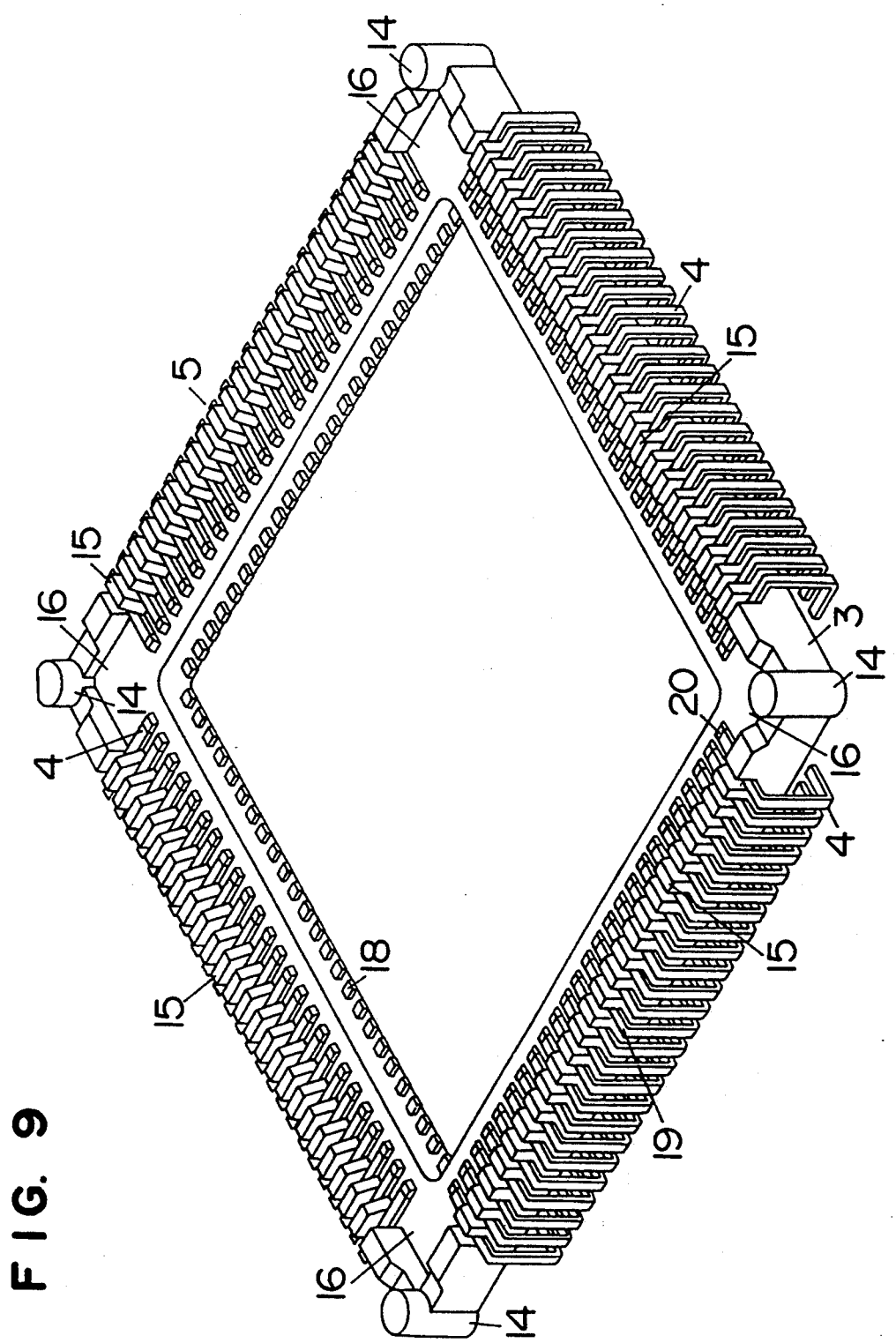
FIG. 9 is a perspective view showing a terminal section of the electronic circuit device illustrated in FIG. 1.
Figure 10:
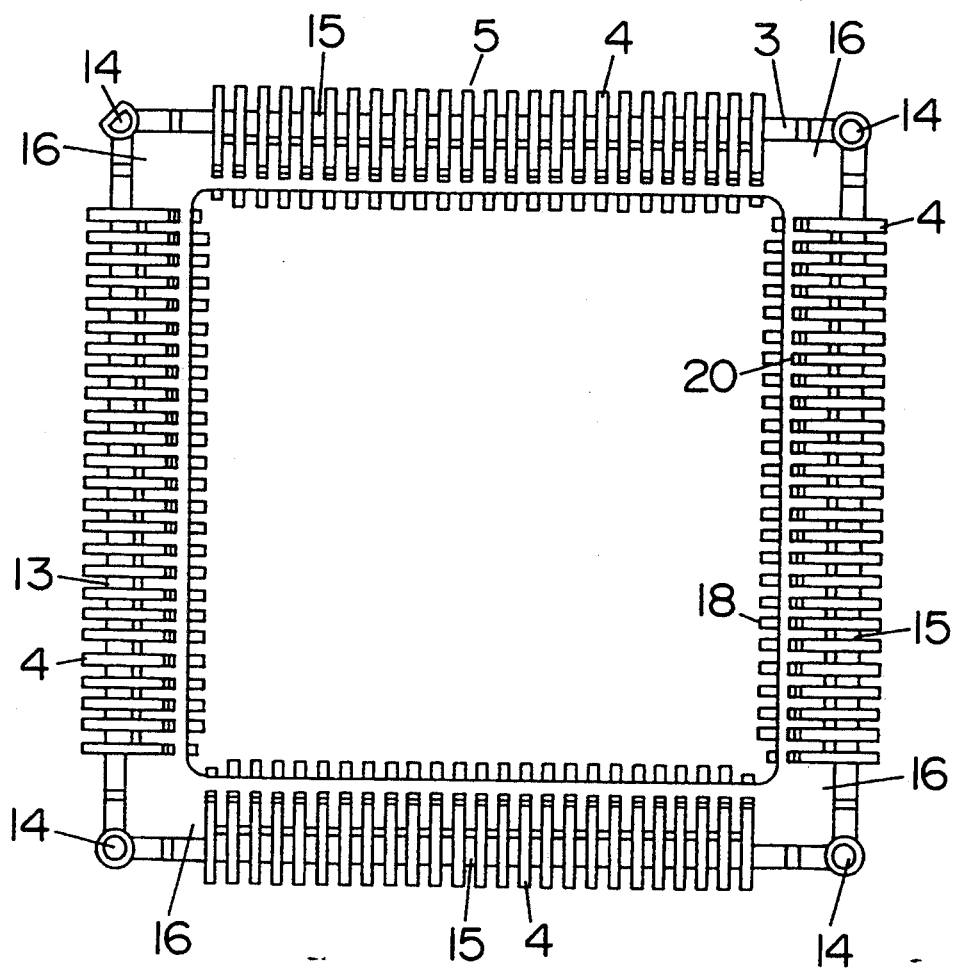
FIG. 10 is a top plan view as viewed from an upper surface of the terminal section illustrated in FIG. 9.
Figure 19A:
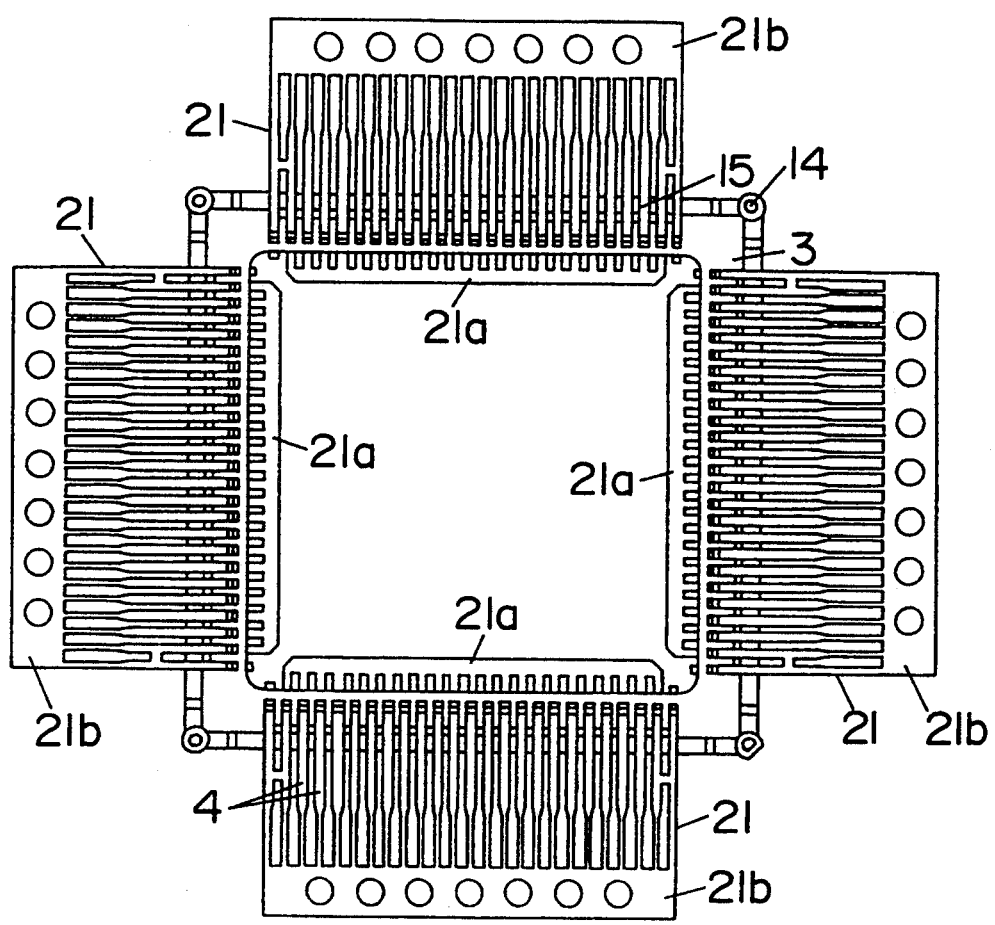
FIG. 19A and FIG. 19B are a top plan view and a side elevational view, respectively, showing a state during insert-molding when the terminal section illustrated in FIG. 9 is manufactured.
Figure 19B:
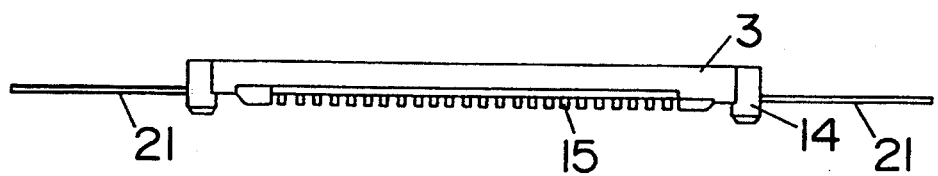

Here, a method of manufacturing the terminal section 5 will be described with reference to FIGS. 19A and 19B. In the present invention, the terminals 4 are integrally embedded by insert-molding upon molding of the frame body 3. In FIGS. 19A and 19B, the reference numeral 21 denotes terminal frames. In each of the terminal frames 21, the opposite ends of each of the plurality of terminals 4 are joined respectively to a pair of connecting portions 21a and 21b. That is, as shown in FIG. 19A, molding of the frame body 3 is effected under such a condition that the four terminal frames 21 are positioned with the connecting portions 21a of the respective terminal frames 21 projecting from the inner peripheral surface of the frame body 3. Thus there can be produced the terminal section 5 in which the terminal frames 21 are insert-molded in the frame body 3. Subsequently, the connecting portions 21a and 21b of the terminal frames 21 are cut while projecting portions of the terminal frames are bent into a reversed C-shaped configuration, whereby there is produced the terminal section 5 as shown in FIG. 9.

At this time, in the present invention, the rearward end of each of the terminals 4 projects from the inner peripheral surface of the frame body 3.

In this manner, the use of the terminal frames 21 can accurately effect fixing of the terminals 4 upon insert-molding. Furthermore, bores 17 are provided in the rear surface of the frame body 3, whereby the terminals 4 are held upon insert-molding to enable adequately securing aligning accuracy of the terminals 4.

(SECOND EMBODIMENT)

Figure 20:
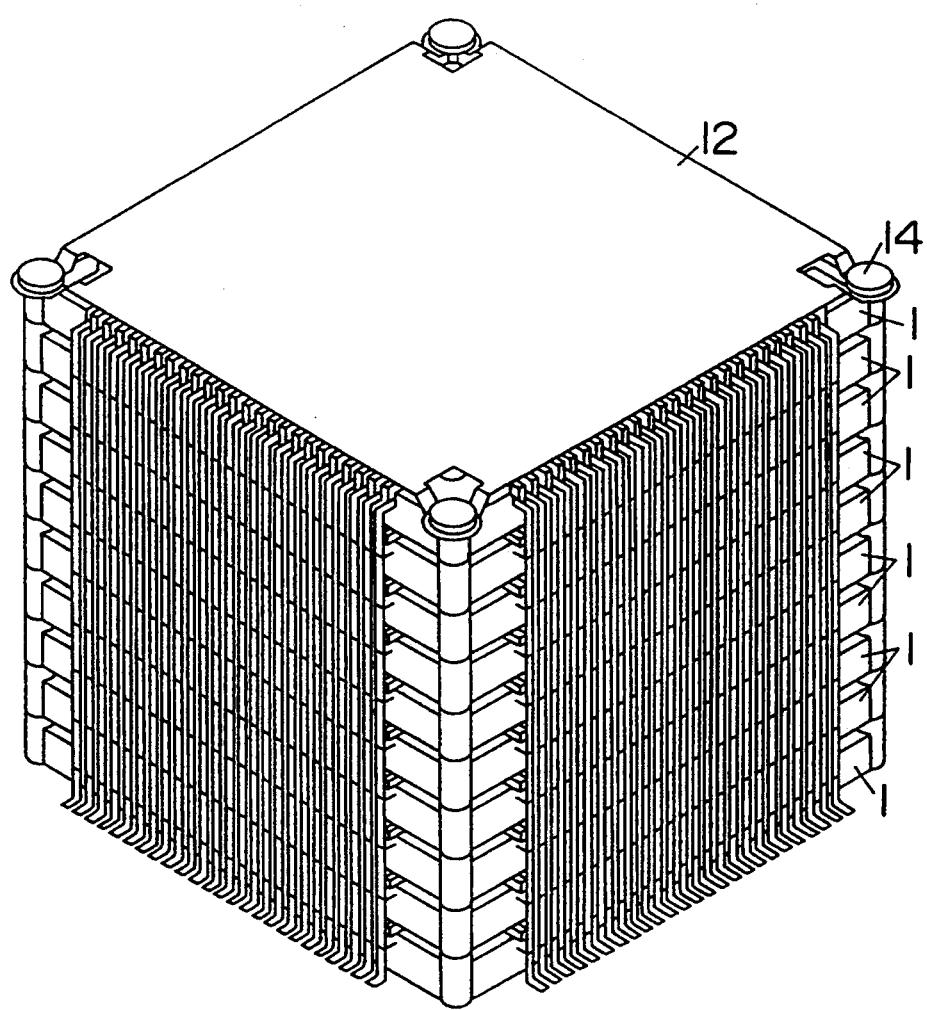
FIG. 20 is a perspective view showing an electronic circuit device according to a second embodiment of the invention.

FIG. 20 shows a second embodiment of the invention. In this embodiment, nine circuit modules 1 and a single circuit module 2 form an electronic circuit device of ten-layered construction. The circuit modules 1 and 2 are the same as those in the above-described first embodiment.

(THIRD EMBODIMENT)

Figure 21:
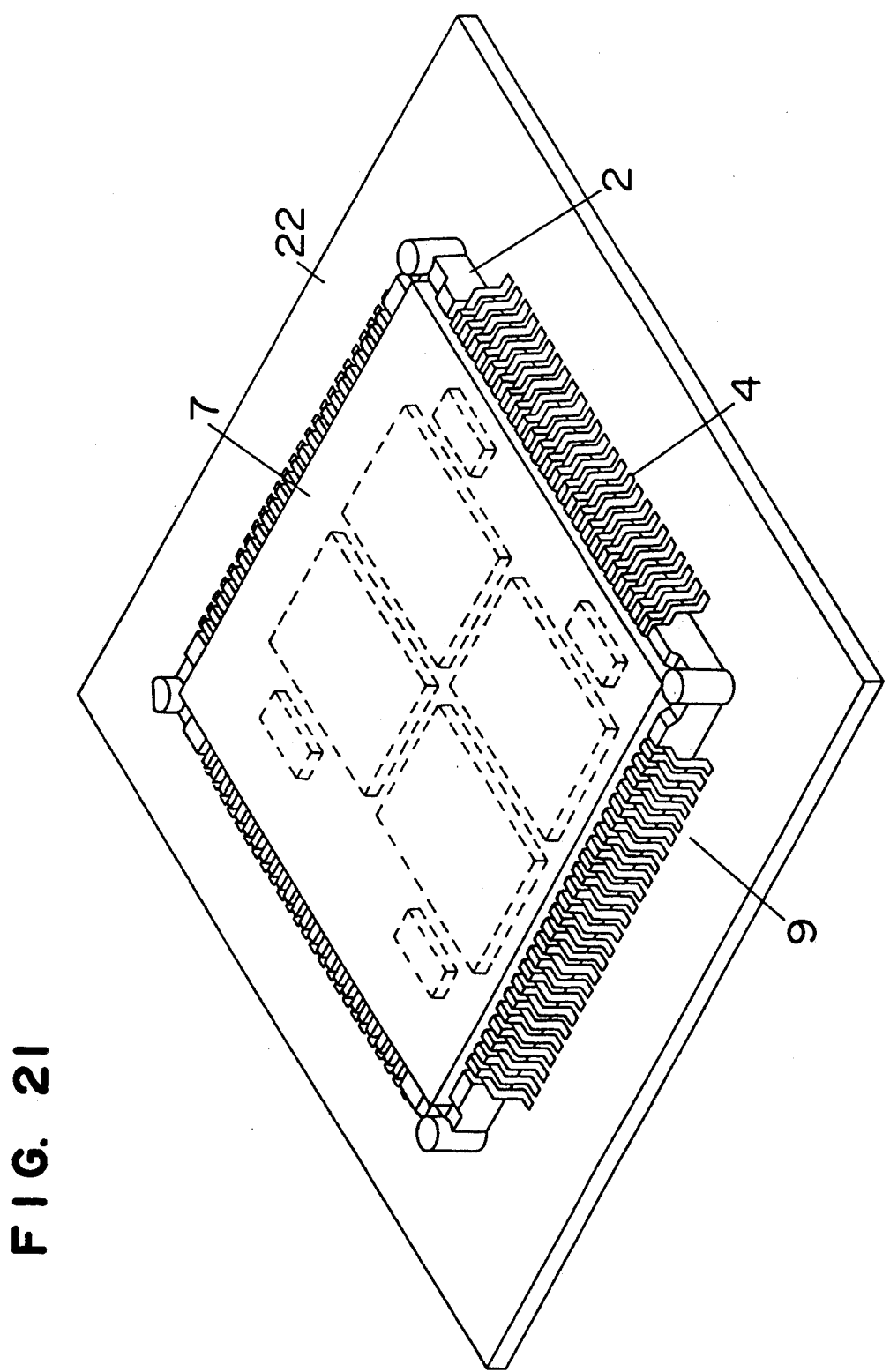
FIG. 21 is a perspective view showing an electronic circuit device according to a third embodiment of the invention.
Figure 24A:
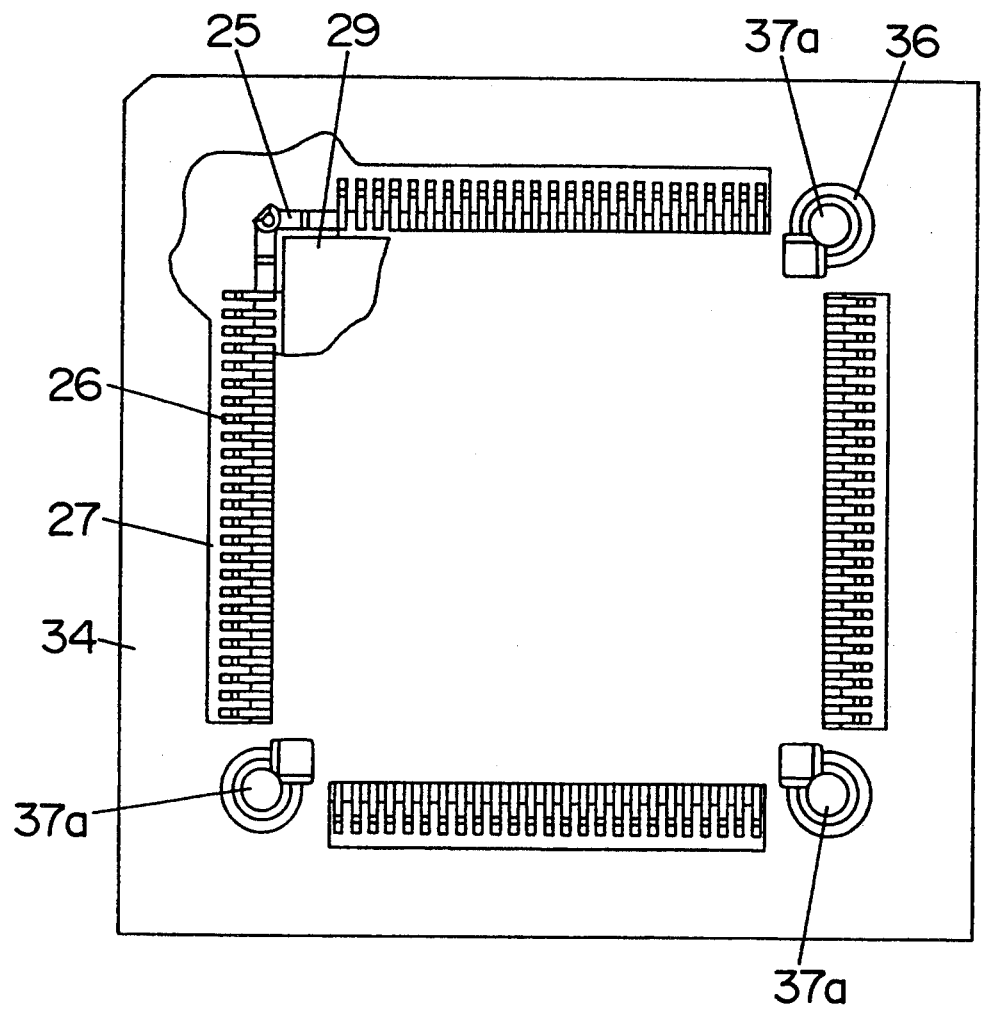
FIG. 24A and FIG. 24B are a top plan view and a side elevational view, respectively, showing the electronic circuit device illustrated in FIG. 22 with a portion thereof notched away.
Figure 24B:
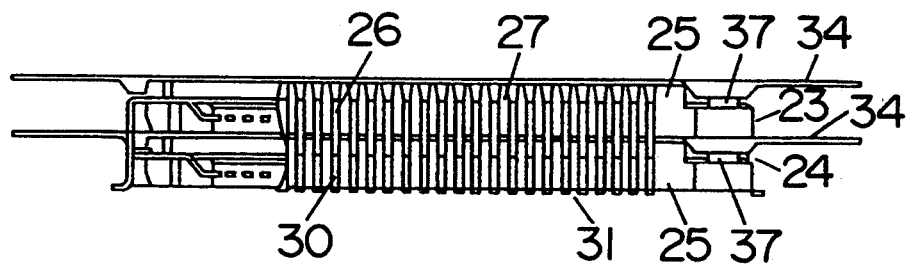

FIG. 21 shows a third embodiment of the invention. In this embodiment, an electronic circuit device is constituted only by a single circuit module 2. In FIG. 21, the reference numeral 22 denotes a printed wiring board. As shown in FIG. 21, the electronic circuit device according to the invention is packaged onto the printed wiring board 22 by soldering or the like, and connection to other electronic circuits is effected.

(FOURTH EMBODIMENT)

Figure 25:
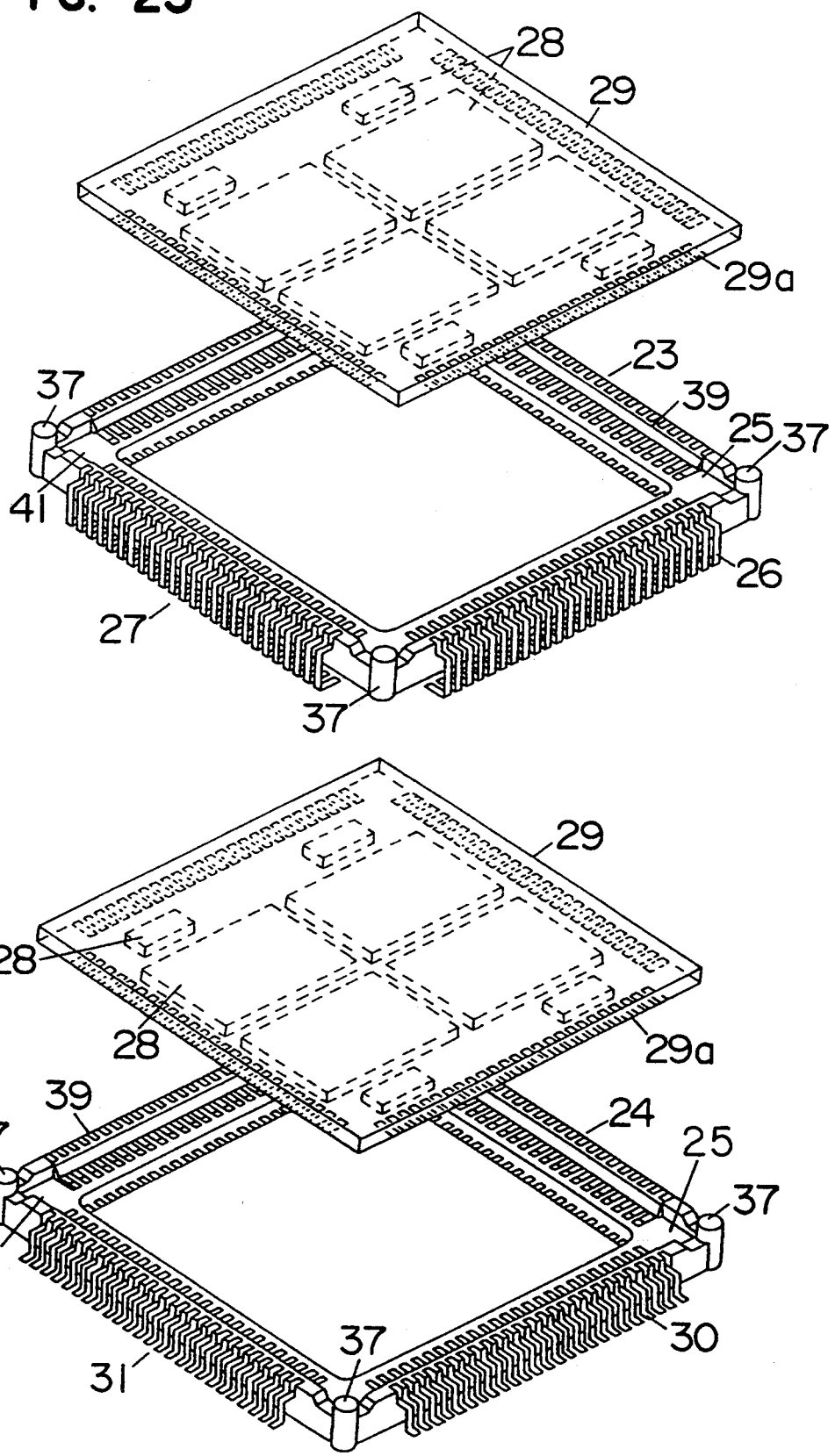
FIG. 25 is an exploded perspective view showing a principal portion of the electronic circuit device illustrated in FIG. 24.

FIG. 22 to FIGS. 24A and 24B show an electronic circuit device according to a fourth embodiment of the invention, and FIG. 25 shows a circuit module of the electronic circuit device. In FIG. 22 to FIG. 25, the reference numerals 23 and 24 denote respective circuit modules each in the form of a square plate configuration for forming a predetermined electronic circuit. In the present embodiment, two circuit modules 23 and 24 are used.

Of the circuit modules 23 and 24, the circuit module 23 comprises a terminal section 27 having a square, annular frame body 25 formed of an insulating material such as synthetic resin and the like and a plurality of terminals 26 provided on the respective frame body portions to extend outwardly of the respective frame body portions and along the side and underside surfaces of the frame body 25 in a C-shaped configuration, and an insulating circuit substrate 29 having wiring patterns each adapted for connection with the respective terminals 26 of the terminal section 27 as by soldering and comprising a member of ceramic and the like, to one surface of which are packaged surface packaging parts 28 such as flip-chip type semiconductors, resistors, capacitors and the like. The reference numeral 29a denotes a connecting lead portion to which the terminals 26 are soldered, and which is arranged on a peripheral edge portion of the circuit substrate 29 in agreement with the arrangement of the terminals 26.

Furthermore, the circuit module 24 comprises, similarly to the circuit module 23, a terminal section 31 having a frame body 25 and a plurality of terminals 30 provided on the respective frame body portions to extend outwardly of the respective frame body portions and along the side and underside surfaces of the frame body 25 in a L-shaped configuration to assume a gull-wing shape, and an insulating circuit substrate 29 mounting thereon a circuit identical to or different from that of the circuit substrate 29 of the circuit module 23.

Moreover, the circuit modules 23 and 24, comprise circuit substrates 29 and terminal sections 27 and 31 and are connected to each other at terminal sections 27 and 31. Further, the terminal sections 27 and 31 have respective thicknesses thereof such that the surface packaging parts 28 of the circuit substrate 29 do not extend beyond the terminal sections 27 and 31.

Figure 26:
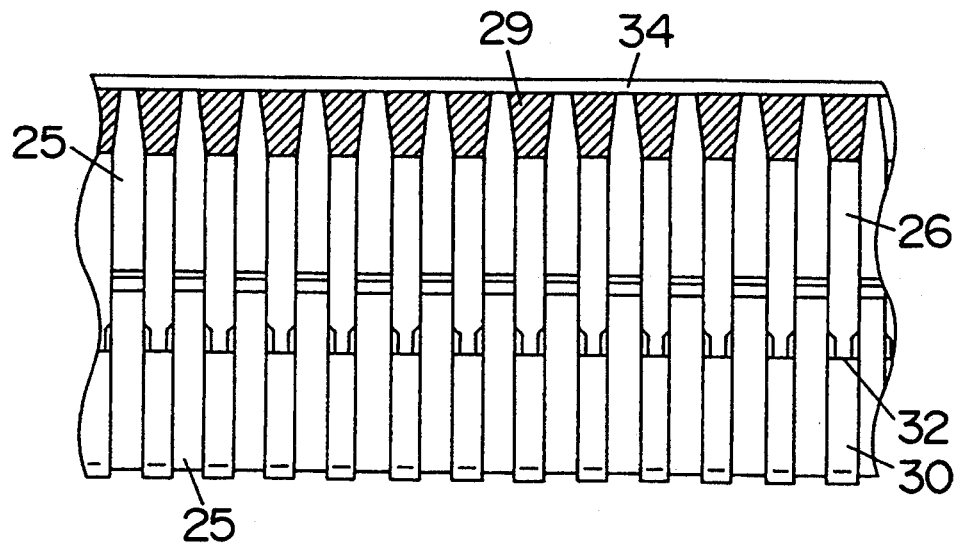
FIG. 26 is an enlarged view showing a structure of a principal portion of the electronic circuit device illustrated in FIG. 24.
Figure 27:
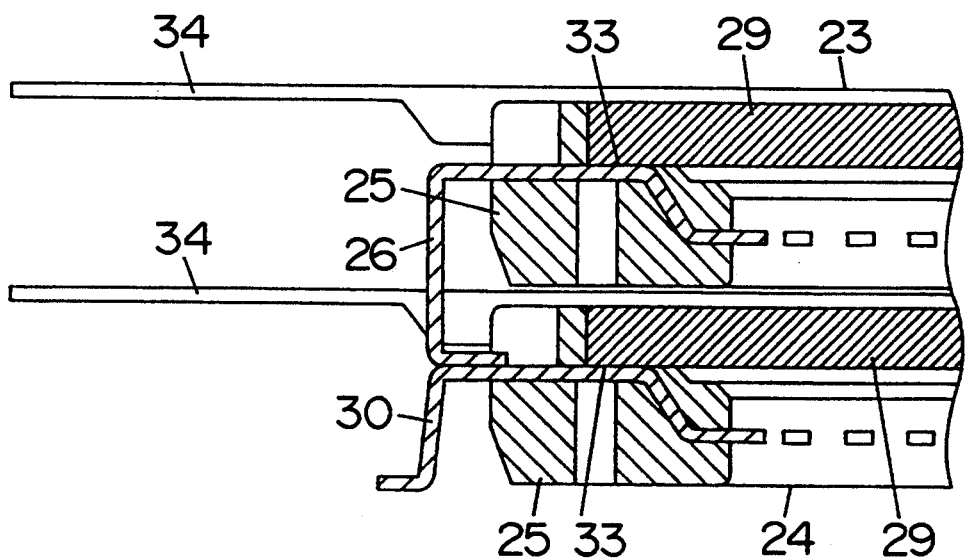
FIG. 27 is an enlarged cross-sectional view showing a structure of a principal portion of the electronic circuit device illustrated in FIG. 24.
Figure 28:
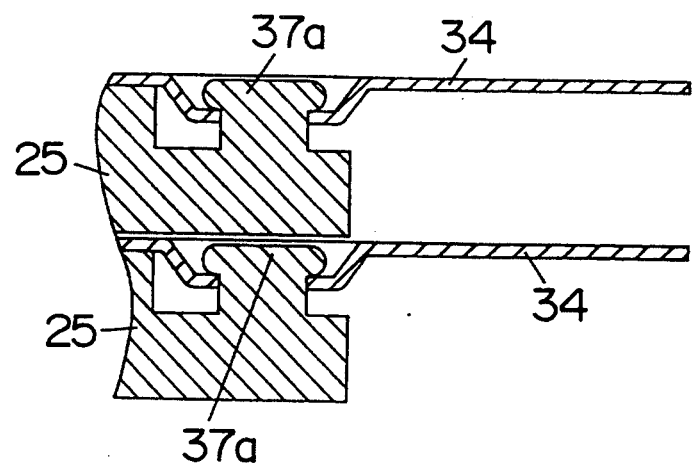
FIG. 28 is an enlarged cross-sectional view showing a structure of a principal portion of the electronic circuit device illustrated in FIG. 24.

As shown in FIGS. 26 to 28, the circuit modules 23 and 24 are positioned such that the terminals 26 and 30 of the respective terminal sections 27 and 31 are in registration with each other, and are piled up each other such that the circuit module 23 is overlapped on the circuit module 24. The terminals 26 and 30 of the respective circuit modules 23 and 24 are electrically and mechanically connected to each other at abutment portions by soldering or the like. In this connection, in Figs. 26 to 28, the reference numeral 32 denotes a connecting areas where the terminals 26 are connected respectively to the terminals 30; and 33, connecting areas where the terminals 26 and 30 are connected respectively to connecting lead portions 29a of the wiring patterns of the circuit substrates 29.

Figure 29:
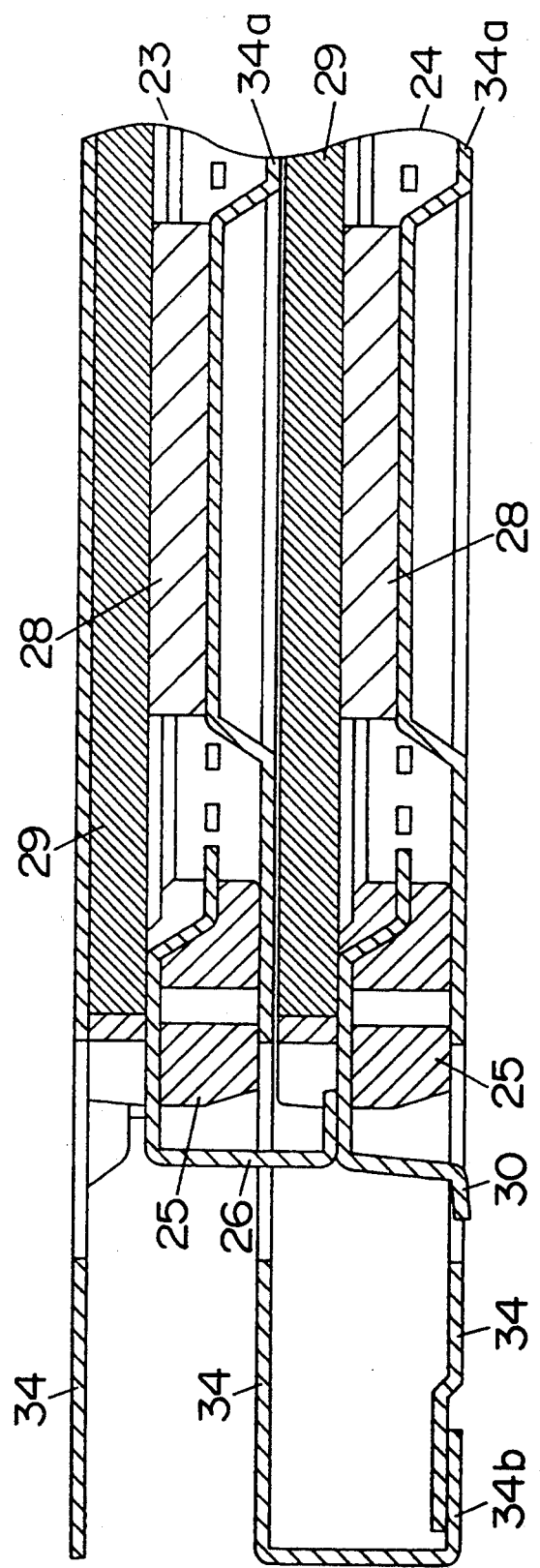
FIG. 29 is an enlarged cross-sectional view showing a structure of a principal portion of the electronic circuit device illustrated in FIG. 24.
Figure 31:
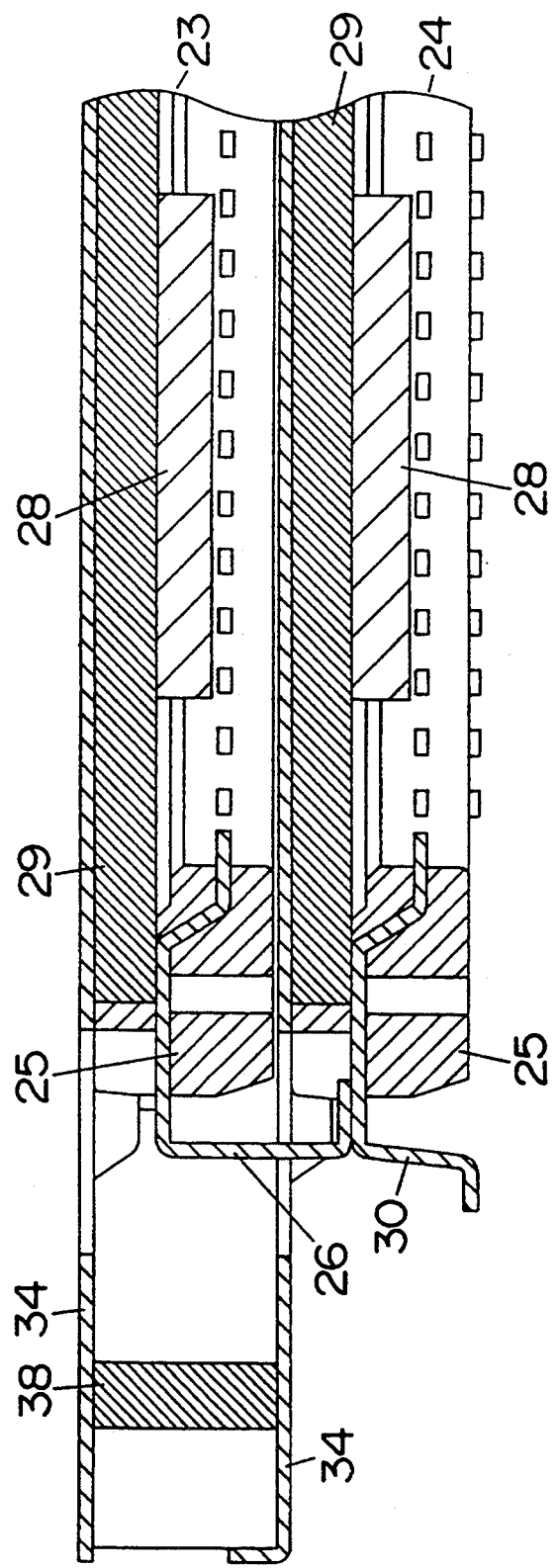
FIG. 31 is an enlarged cross-sectional view showing another example of parts of a principal portion of the electronic circuit device illustrated in FIG. 24.
Figure 32:
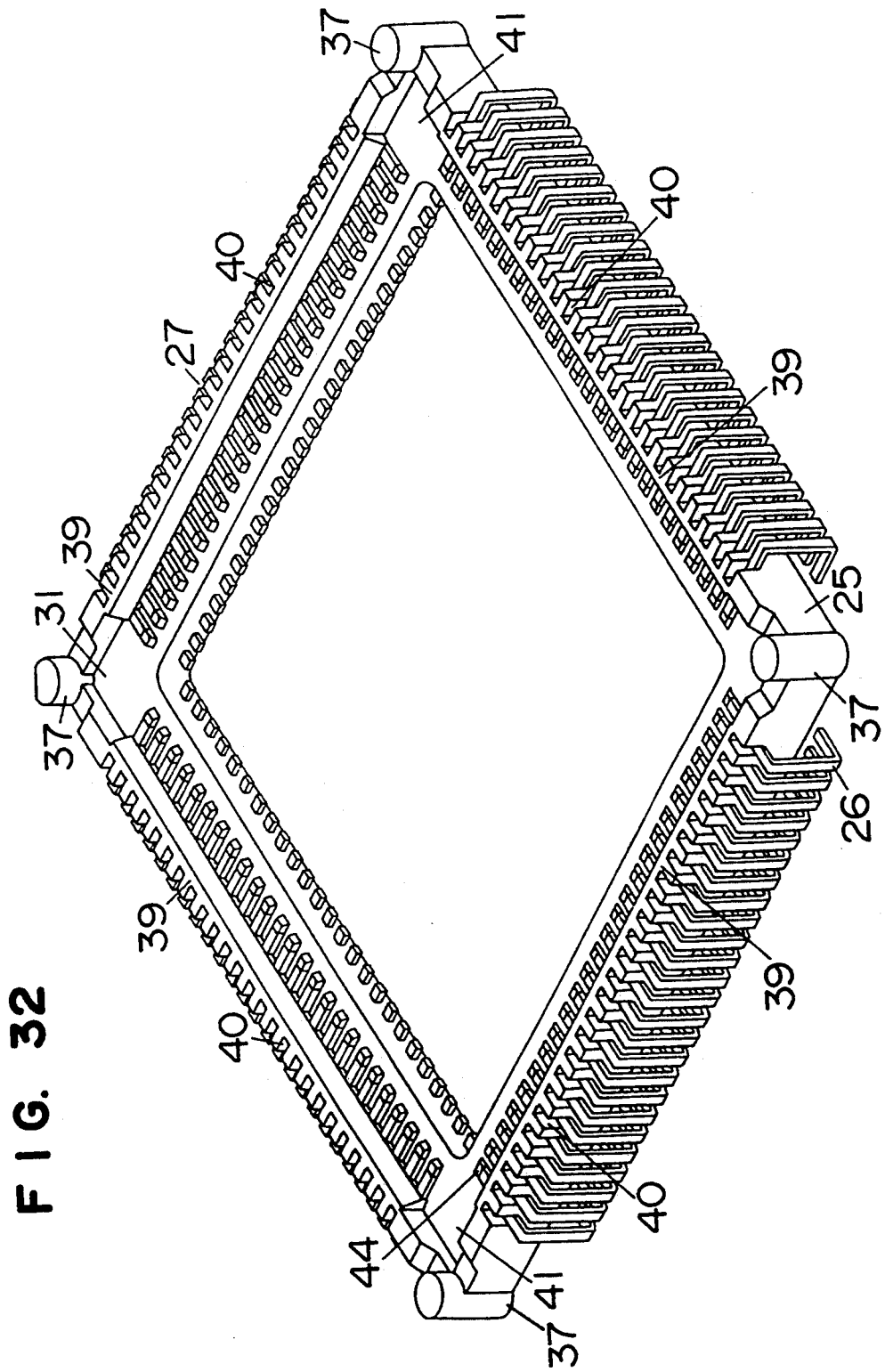
FIG. 32 is a perspective view showing a terminal section of the electronic circuit device illustrated in FIG. 24.

Heat-radiating plates 34 in the form of a square plate configuration made of metal are arranged respectively at the tops of the respective circuit modules 23 and 24 piled up each other in this manner through silicon grease or the like, to thereby effect heat radiation of the circuit modules 23 and 24. The heat-radiating plates 34 are larger in area than the circuit modules 23 and 24, respectively. Windows 35 are provided in the heat-radiating plates 34 to correspond to upper portions of the terminal sections 27 and 31 so as to provide image-recognition of the terminals 26 and 30 when the electronic circuit device is packaged. Furthermore, fixing bores 36 are formed in corner portions of the heat-radiating plates 34, for fixing the heat radiating plates 34 respectively to the frame bodies 25 of the circuit modules 23 and 24 by caulking. That is, projections 37 are provided respectively at the corner portions of the frame bodies 25 of the respective circuit modules 23 and 24. The fixing bores 36 in the heat radiating plate 34 are fitted respectively over the projections 37. As shown in FIG. 28, the projections 37 are pressed to caulk the heat-radiating plates 34 respectively to the projections 37 of the frame bodies 25. Thus, the heat-radiating plates 34 are fixed respectively to the frame bodies 25. In FIG. 28, the reference numeral 37a denote caulked portions which are provided respectively by pressing of the projections 37. In this connection, in the case where the surface packaging parts 28 which particularly require a heat-radiating characteristic are packaged, projections 34a are provided respectively on the heat-radiating plates 34 as shown in FIG. 29, so that heat-radiating plates 34 and the surface packaging parts 28 are in direct contact with each other through silicon grease or the like, thereby to improve heat-radiation advantages or effects. At this time, the lowermost heat-radiating plate 34 is held by a peripheral portion 34b, which is folded back in the form of an L-shaped configuration, of a heat-radiating plate 34 disposed on the circuit module 24. Further, as shown in FIGS. 30 and 31, heat sinks 38 in the form of a comb may be arranged between upper and lower heat-radiating plates 34, to improve heat-radiating advantages. With the arrangement, heat radiation can reliably be effected as compared with the case where the heat-radiating plates 34 and the substrates are in direct contact respectively with each other to radiate heat.

In connection with the above, if connecting terminals for shielding are provided respectively on the heat-radiating plates 34 in the present embodiment, there can be produced electromagnetic shielding effects similar to those of the roof 12 in the first embodiment.

The terminal sections 27 and 31 of the respective circuit modules 23 and 24 will next be described in detail. In this connection, the terminal section 27 and the terminal section 31 are different from each other only in the terminals 26 and 30, and are the same as each other in terms of the remaining constitution. Thus, in the following description, only the terminal section 27 will be described with reference to FIGS. 32 to 36.

As shown in FIGS. 32 to 36, the frame body 25 of the terminal section 27 is provided at outer edge portions of upper portions of four respective frame sections with projecting portions 39 which serve as effecting positional regulation at an outer end. A plurality of grooves 40 are provided on the outer side of the projecting portions 39 with predetermined spaces left therebetween outwardly. The terminals 26 are taken out through the grooves 40, respectively. With the arrangement, it is possible to overlap the first circuit module on the second circuit module without reduction in the strength of the frame body, as compared with the arrangement in which a plurality of projecting portions are provided on the outer peripheral portion of each of four frame sections with predetermined spaces left therebetween. Planar portions 41 lower than the projecting portions 39 and the projections 37 are provided respectively at the corners of the frame body 25.

Figure 33:
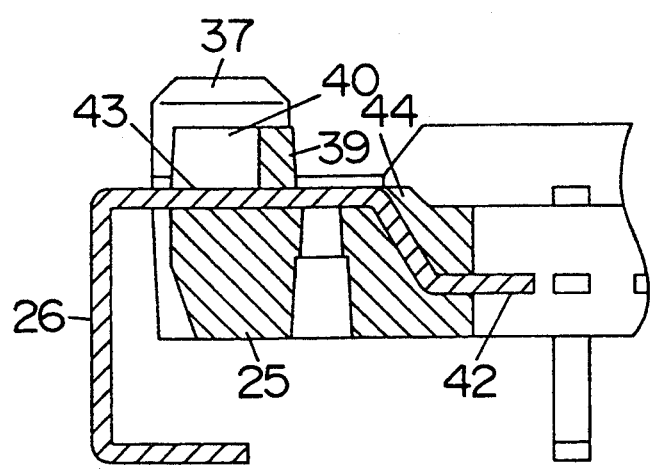
FIG. 33 is an enlarged cross-sectional view showing a principal portion of the terminal section illustrated in FIG. 32.
Figure 34:
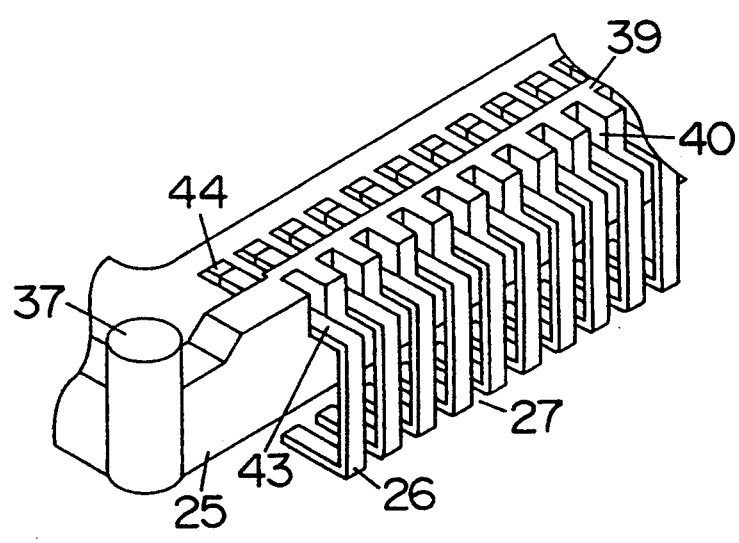
FIG. 34 is an enlarged perspective view showing a principal portion of the terminal section illustrated in FIG. 32.
Figure 35:
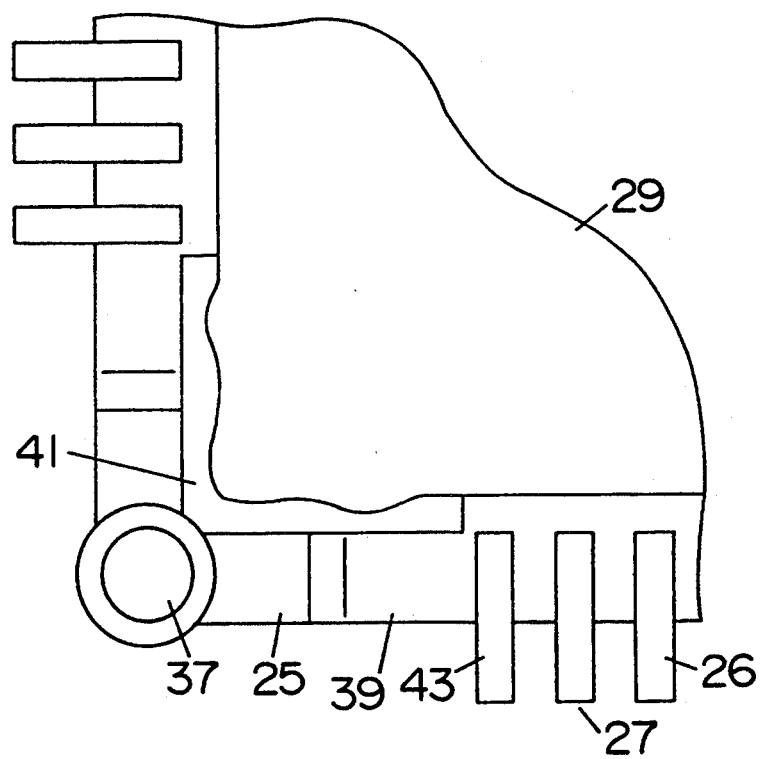
FIG. 35 is an enlarged view showing a principal portion of the terminal section illustrated in FIG. 32.

Moreover, each of the terminals 26 of the terminal section 27 is bent to have forward ends thereof project outwardly from the frame body 25. As shown in FIG. 35, the respective rearward ends of terminals 26 are embedded in the frame body 25 to project from the inner peripheral surface of the frame body 25. Furthermore, intermediate portions of the respective terminals 26 are so provided as to become planar along the upper surface of the frame body 25 as shown in FIGS. 33 to 35, and are so arranged as to project slightly from the upper surface of the frame body 25. In this connection, in FIGS. 33 to 35, the reference numeral 42 denotes projecting portions of the terminals 26 projecting from the inner peripheral surface of the frame body 25, while 43 denotes planar portions provided respectively at the intermediate portions of the terminals 26.

Further, boundary portions between the planar portions 43 of the respective terminals 26 and the rearward end portion embedded in the frame body 25 are covered respectively with resin portions 44.

Thus the terminals 26 of the terminal section 27 are connected to the circuit substrate 29 at the planar portions 43 which project from the upper surface of the frame body 25 as shown in FIG. 33.

In the present invention, the outward side edges of the circuit substrate 29 abut respectively against the projecting portions 39 of the frame body 25 to thereby be positioned, whereby it is possible to position the circuit substrate 29 with respect to the frame body 25 and to accurately and easily effect connection between the terminal sections 27 and the circuit substrate 29. As shown in FIG. 35, four corners of the projecting portions 39 are relieved in a manner to form planar portions 41 through not to abut against the substrate 29 whereby interference between the flash of the substrate 29 and the projecting portions are prevented from occurring. Thus, it is possible to effect connection accurately.

Figure 36:
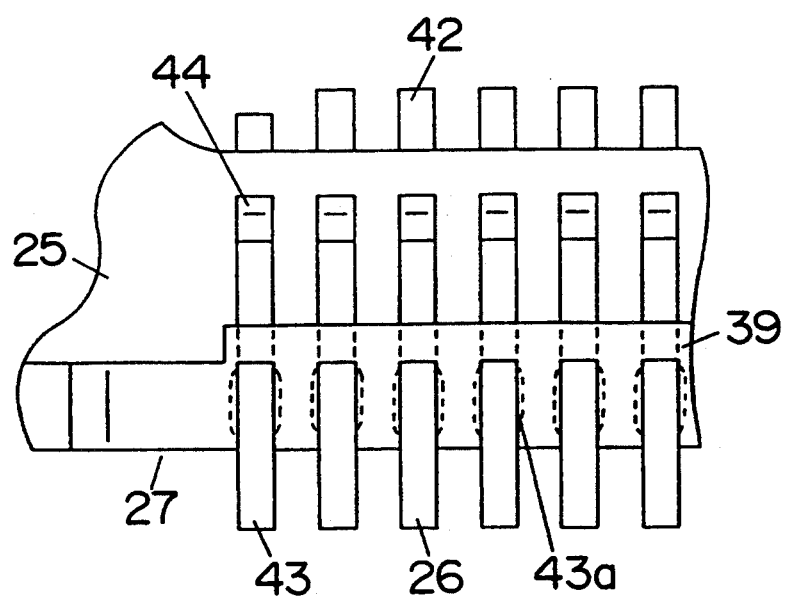
FIG. 36 is an enlarged view showing a principal portion of the terminal section illustrated in FIG. 32.

Furthermore, in the present invention, the planar portions 43 of the respective terminals 26 are partly embedded in the projecting portions 39 as shown in FIG. 36. The planar portions 43 of the respective terminals 26 are fixed by the embedded portions 43a, and accuracy of flatness for planar portions 43 is secured thereby.

As described above, according to the invention, a circuit module comprises a terminal section having a annular insulating frame body and a plurality of terminals provided on the respective frame body portions to extend outwardly therefrom, and a circuit substrate having wiring patterns each adapted for connection with the respective terminals of the terminal section and packaging to one surface thereof surface packaging parts with the surface packaging parts directed toward the inside of the terminal section. A plurality of these circuit modules are stacked on one another and are connected to one another by terminals, so that high-density packaging circuit substrates can be readily connected to one another by the terminal sections with accuracy, whereby the circuit modules can be readily and accurately arranged in a multi-layered manner to enable realizing high-density packaging.

What is claimed is:

1. An electronic circuit device comprising:
   at least one first circuit module comprising (i) a first terminal section having a first annular insulating frame body and a first plurality of terminals provided on said first annular insulating frame body to extend outwardly from said first annular insulating frame body in a C-shaped configuration, and (ii) a first circuit substrate having a first plurality of wiring patterns adapted for connection with the first plurality of terminals, said first circuit substrate having mounted thereon a first circuitry which is connected to said first plurality of terminals through said first plurality of wiring patterns;
   a second circuit module comprising (i) a second terminal section having a second annular insulating frame body and a second plurality of terminals provided on said second annular insulating frame body to extend outwardly from said second annular insulating frame body in an L-shaped configuration, and (ii) a second circuit substrate having a second plurality of wiring patterns adapted for connection with the second plurality of terminals, said second circuit substrate having mounted thereon a second circuitry which is connected to said second plurality of terminals through said second plurality of wiring patterns;
   said at least one first circuit module being stacked on said second circuit module to provide stacked circuit modules, said second circuit module being disposed at a lowermost area of said stacked circuit modules, and the first and second circuit modules being connected to one another by direct engagement of said first and second pluralities of terminals; and
   a roof means for providing electromagnetic shielding, provided above said at least one first circuit module.

2. An electronic circuit device according to claim 1, wherein heat-radiating plates for heat radiation are provided to abut against the circuit substrates of the respective circuit modules.

3. An electronic circuit device according to claim 2, wherein a connecting terminal for electromagnetic shielding is provided on each of said heat-radiating plates.

4. An electronic circuit device according to claim 2, wherein said heat-radiating plate are provided with windows which are positioned to correspond to terminals of the respective first and second terminal sections.

5. An electronic circuit device according to claim 2, wherein said heat-radiating plate is provided with at least one projection means for causing said heat-radiating plate and said first and second circuitry to be in direct contact with each other.

6. An electronic circuit device according to claim 1, wherein projections are provided at corners of the respective frame bodies of the respective first and second circuit modules, which projections serve to support said stacked circuit modules in a spaced manner.

7. An electronic circuit device according to claim 1, wherein said first and second terminal sections are provided at the upper and peripheral portions of the respective frame bodies with a plurality of projecting portions which serve as effecting positional regulation of the outer ends of the respective circuit substrates and are disposed with predetermined spaces therebetween, and wherein a plurality of terminals are taken out through between the projecting portions.

8. An electronic circuit device according to claim 2, wherein said annular insulating frame body of each of said first and second terminal sections comprises a plurality of projecting portions disposed on outer edges of an upper surface of said annular insulating frame body, and wherein each terminal of said first and second pluralities of terminals is disposed between two of said projection portions.

9. An electronic circuit device according to claim 7, wherein the projecting portions provided on said first and second terminal sections are tapered.

10. An electronic circuit device according to claim 9, wherein the projecting portions of said first and second terminal sections for positioning said circuit substrates are relieved at four corners thereof to be in non-contact with said circuit substrates at the relieved portions.

11. An electronic circuit device according to claim 1, wherein, in said first and second terminal sections, terminals are provided to be insert-molded in said frame body.

12. An electronic circuit device according to claim 9, wherein the terminals of said first and second terminal sections are constructed such that the portions thereof near the rear ends are embedded in said frame body with the rear ends projecting from the inner peripheral surface of said frame body, and flat portions midway the lengths of said terminals are disposed above the upper surface of said frame body and are extended to a periphery of said frame body through between said projecting portions.

13. An electronic circuit device according to claim 9, wherein portions of the terminals disposed between said projecting portions are partly embedded in said projecting portions.

14. An electronic circuit device according to claim 9, wherein small projections are provided on surfaces of said projecting portions of said frame body where the outer edges of said circuit substrates engage.

15. An electronic circuit device according to claim 1, wherein said first and second terminal sections are constructed such that openings are formed in the underside portions of said frame body to lead to said terminals.

16. A method of manufacturing an electronic circuit device of claim 1, comprising the steps of:
preparing terminal frames comprising a plurality of terminals, of which opposite ends are connected by connecting portions;
insert molding said terminal frames in a frame body while the connecting portions at one ends of said terminal frames project from the inner peripheral surface of said frame body; and
cutting said connecting portions.

17. An electronic circuit device according to claim 8, wherein the projecting portions provided on said first and second terminal sections are tapered.

18. An electronic circuit device according to claim 1, wherein each of said first and second circuities comprises a plurality of surface packaging parts disposed within an area bounded by a corresponding one of said first and second terminal sections.

* * * * *